(12) United States Patent
Nakashima et al.

(10) Patent No.: US 8,182,968 B2
(45) Date of Patent: May 22, 2012

(54) COLOR FILTER AND METHOD FOR PRODUCING THE SAME

(75) Inventors: Taeko Nakashima, Kanagawa (JP); Hiroshi Taguchi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 920 days.

(21) Appl. No.: 12/058,330

(22) Filed: Mar. 28, 2008

(65) Prior Publication Data
US 2008/0286665 A1 Nov. 20, 2008

(30) Foreign Application Priority Data
Mar. 29, 2007 (JP) ................................ 2007-089028

(51) Int. Cl.
*G02B 5/20* (2006.01)
(52) U.S. Cl. .......................................................... 430/7
(58) Field of Classification Search ........................ None
See application file for complete search history.

(56) References Cited

U.S. PATENT DOCUMENTS
2003/0129504 A1 * 7/2003 Wakata et al. .................... 430/5

FOREIGN PATENT DOCUMENTS
| EP | 0 713 144 A2 | 5/1996 |
|---|---|---|
| JP | 02-127602 | 5/1990 |
| JP | 2874091 | 1/1999 |
| JP | 11-038226 | 2/1999 |
| JP | 2000-035670 | 2/2000 |
| JP | 2001-183829 A | 7/2001 |
| JP | 2004-295084 A | 10/2004 |
| JP | 2005-025169 A | 2/2005 |
| JP | 2005-242279 A | 9/2005 |
| JP | 2006-030541 A | 2/2006 |
| JP | 2006-162784 A * | 6/2006 |
| JP | 2007-034119 A | 2/2007 |

OTHER PUBLICATIONS

Computer-generated translation of JP 11-038226 (Feb. 1999).*
Computer-generated translation of JP 2007-034119 (Feb. 2007).*
Computer-generated transaltion of JP 2006-162784 (Jun. 2006).*
EP Communication, dated Jun. 23, 2009, issued in corresponding EP Application No. 08153396.0, 7 pages.
Office Action dated Jul. 5, 2011 in Japanese Application No. JP 2007-089028.
Office Action dated Dec. 6, 2011 on Japanese Application No. 2007-089028.

* cited by examiner

*Primary Examiner* — John A. McPherson
(74) *Attorney, Agent, or Firm* — Sughrue Mion, PLLC

(57) ABSTRACT

The present invention provides a method for producing a color filter, the method including: applying an adhesion auxiliary agent onto an inorganic material; forming a curable layer on the inorganic material to which the adhesion auxiliary agent has been applied by applying a curable pigment composition containing an organosilane compound (A) represented by Formula (I) below (wherein L is a monovalent organic group; $R^1$ and $R^2$ are hydrocarbon groups; and n is an integer from 1 to 3), a photopolymerization initiator (B), a compound (C) having an ethylenically unsaturated double bond, and a pigment (D); exposing the curable layer to light in a pattern using a mask; and a developing the curable layer after exposure to form a color pattern.

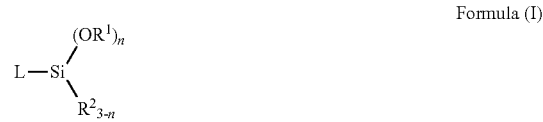

Formula (I)

14 Claims, No Drawings

COLOR FILTER AND METHOD FOR PRODUCING THE SAME

CROSS-REFERENCE TO RELATED APPLICATION

This application claims priority under 35USC 119 from Japanese Patent Application No. 2007-089028, the disclosure of which is incorporated by reference herein.

BACKGROUND OF THE INVENTION

1. Field of the Invention

The present invention relates to a color filter and a method for producing the same being most suitable for the fabrication of a color filter to be used in a liquid crystal display, solid-state image sensing device, or the like.

2. Description of the Related Art

A color filter is an essential component part of a liquid crystal display (LCD) and of solid-state image sensing devices (such as a CCD, CMOS, etc.)

Compared with a CRT, as a display device an LCD is more compact and is equivalent or superior in performance. Therefore, the LCD is gradually replacing the traditional CRT as the display member of television screens, personal computer screens, and other display devices. Recently the technological trend in LCDs has been away from conventional monitors that have a screen with a relatively small surface area, and toward TVs that require a large, high quality image.

In LCD color filter applications the size of the substrate is expanded for large-screen TV use, and to increase productivity when such a large substrate is used, a low energy-curable composition is desirable for forming the color pixels (i.e., color filters) for red (R), green (G), and blue (B), etc.

Furthermore, an LCD used in a TV requires higher image quality than that of a conventional monitor. This means it requires enhanced contrast and color purity. For enhanced contrast the particle size of the colorants (organic pigments, etc.) in the curable composition used for forming the color pixels (color filters) must be reduced (see, for example, Japanese Patent Application Laid-open No. 2006-30541). However, as the particle size has decreased, the amount of dispersant added to disperse the pigment has tended to increase. Moreover, for enhanced color purity the content of colorant (organic pigment, etc.) in the solids of the curable composition must be increased. However, as the colorant content has increased, the relative content of photopolymerization initiator and photopolymerizable monomer in the solids of the curable composition has tended to decrease.

On the one hand, thin film pattern forming has advanced in color filter applications for solid-state image sensing devices, and concurrently the pigment concentration in the curable resin compositions has also increased. In addition, the ratio of pigment dispersant in the curable resin compositions has tended to increase as the pigment particles have become finer. Therefore, the relative content of photopolymerization initiator and photopolymerizable monomer has decreased.

Thus, in color filter applications for both LCDs and solid-state image sensing devices, the content of photopolymerization initiator and photopolymerizable monomer, which are both necessary components for curing a curable composition, has become restricted, and the pigment concentration has also increased. As a result, adhesion between the pigment and the inorganic material forming the substrate is no longer sufficient, and forming a desired pattern has become markedly more difficult.

Concerning the above, techniques involving the introduction of a silane coupling agent to enhance adhesion to the inorganic substrate have been proposed (for example, Japanese Patent Application Laid-open No. H2-127602, Japanese Patent Publication No. 2874091, and Japanese Patent Application Laid-open No. H11-38226). In addition, technology involving the introduction of a primary or secondary amine type silane coupling agent has been proposed as a technique to prevent development residue in regions that are conventionally developed and removed (unexposed parts in a negative photoresist) (for example, see Japanese Patent Application Laid-open No. 2000-35670).

SUMMARY OF THE INVENTION

The present invention has been made in view of the above circumstances and provides a color filter and method for producing the same.

A first aspect of the present invention provides a method for producing a color filter including:

applying an adhesion auxiliary agent onto an inorganic material;

forming a curable layer on the inorganic material to which the adhesion auxiliary agent has been applied by applying a curable pigment composition containing an organosilane compound (A) represented by Formula (I) below, a photopolymerization initiator (B), a compound (C) having an ethylenically unsaturated double bond, and a pigment (D);

exposing the curable layer to light patternwise using a mask; and developing the curable layer after exposure to form a color pattern.

Formula (I)

wherein, in Formula (I), L represents a monovalent organic group; $R^1$ and $R^2$ each independently represent hydrocarbon groups; and n represents an integer of 1 to 3.

A second aspect of the present invention provides a color filter having a color pattern on a surface of an inorganic material to which an adhesion auxiliary agent has been applied.

DETAILED DESCRIPTION OF THE INVENTION

Below the method for producing the color filter of the present invention is explained in detail, and the color filter of the present invention is also described in detail in that explanation.

The method for producing the color filter of the present invention constitutes performing an adhesion treatment step wherein an adhesion auxiliary agent is applied (preferably by coating or vapor deposition) onto an inorganic material; a layer forming step wherein a curable pigment composition is applied (preferably coated) onto the aforementioned adhesion auxiliary agent applied-surface of an inorganic material whereto the adhesion auxiliary agent has been applied to form a curable layer thereon; an exposure step wherein the aforementioned curable layer is exposed to light in a pattern using a mask; and a development step wherein the above curable layer is developed after exposure to form a color pattern. The method for producing the color filter of the present invention may also constitute providing other configurations thereof as needed.

In the method for producing the color filter of the present invention, a condition with excellent development properties and excellent adhesion of the pigment or dispersant to the region whereto the adhesion auxiliary agent has been applied is created via the organosilane compound by using an inorganic material whereto an adhesion auxiliary agent has been applied as the substrate constituting the color filter and including the specific organosilane compound in the curable layer formed on the region of the inorganic material whereto the adhesion auxiliary agent has been applied (for example, the surface of an inorganic substrate whereto an adhesion auxiliary agent has been applied) without worsening the development residue in the regions to be developed and removed, and a color pattern may be formed having excellent adhesion to the surface of the inorganic material thereby.

In addition, it is possible thereby to manufacture a color filter with a simple process involving application of an adhesion auxiliary agent, formation of a layer, exposure of the layer, and development of the layer, and productivity may be increased thereby.

Each step of the process for producing the color filter of the present invention is explained in detail below.

(Adhesion Treatment Step)

In the adhesion treatment step an adhesion auxiliary agent is applied onto an inorganic substrate. Application of the adhesion auxiliary agent can be performed by a method such as coating, inkjet application, printing, vapor deposition, and the like.

If a coating application is performed, various publicly known coating methods such as slit coating, spin coating, cast coating, roll coating, spray coating, etc., may be used.

If an inkjet application is performed, a method may be used wherein the adhesion auxiliary agent is ejected by the inkjet method using an inkjet head. Suitable inkjet heads include, for example, a charge-control type wherein the ink is ejected utilizing electrostatic attractive force; a drop-on-demand type (pressure pulse type) utilizing the vibrational pressure of a piezoelectric element; an acoustic inkjet type wherein an electric signal is converted to an acoustic beam, ink is exposed thereto, and acoustic radiation pressure is used to eject the ink; and a thermal inkjet type (BUBBLEJET™) type wherein the ink is heated to form bubbles, and the resulting pressure is utilized to eject the ink.

If a printing application is used, the screen printing process may be used.

If vapor deposition is used, atomization by spraying, deposition by evaporation, dipping, etc., may be listed as examples thereof. Among these alternatives, vapor deposition by evaporation is preferred, and in such a case a treatment of about 30 to 600 seconds under reduced pressure is preferred.

If coating and inkjet applications are used, a solution prepared using an adhesion auxiliary agent may be used. This solution, for example, may be one which is prepared by the desired adhesion auxiliary agent is mixed into and dissolved in a solvent such as cyclohexane and the like.

Preferably, after application of the adhesion auxiliary agent as described above, drying is performed for about 30 to 600 seconds at 50 to 300° C. using a hot plate, oven, and the like.

Silicon nitride, silicon oxide and the like may be used as the adhesion auxiliary agent of the present invention from the viewpoints of the adhesion of the cured parts (image) to the curable layer (particularly, the organosilane compound) described below and the development properties of the uncured parts. Among these alternatives, the compound represented by Formula (A) below is preferred from the viewpoint of forming a colored pattern having excellent adhesion to the surface of the inorganic substrate without worsening the development residue of the uncured parts (unexposed parts). However, the adhesion auxiliary agent is not limited thereto in the present invention.

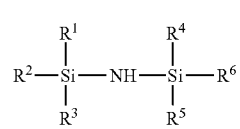

Formula (A)

In Formula (A) above, $R^1$ to $R^6$ each independently represent a hydrocarbon group of 1 to 4 carbon atoms, optionally having a cyclic structure and/or unsaturated bond(s). Examples of the hydrocarbon group of 1 to 4 carbon atoms include a methyl group, ethyl group, propyl group, butyl group, and the like. Among these alternatives, a structure wherein $R^1$ to $R^6$ are all methyl groups is preferred.

Concrete examples of the compound represented by Formula (A) above are cited below. However, the present invention is not restricted thereto.

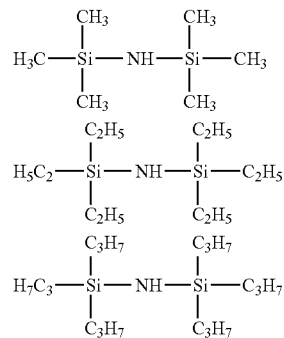

With respect to the amount of the adhesion auxiliary agent on the inorganic substrate, the water contact angle on the inorganic substrate treated with adhesion auxiliary agent is preferably 50° or greater, and more preferably 60° or greater. When the contact angle lies within the above range, the adhesion of the color pattern constituting the color filter may be effectively improved while minimizing the development residue of the curable layer described below in the unexposed regions that are to be developed and removed.

Examples of the inorganic material include an inorganic film formed on an arbitrary substrate, an inorganic base material (including a substrate, sheet, film, and the like), etc., and an inorganic base material is preferred. Even more preferred examples include a photoelectric transducer substrate used in solid-state image pick-up devices, and the like, e.g., for example, a silicon substrate (particularly, an inorganic substrate such as an SiN, $SiO_2$, SiON substrates and the like), and a complementary metal oxide semiconductor (CMOS), etc are included. These substrates are sometimes formed with black stripes separate pixels into each pixel.

Among these alternatives, an inorganic substrate treated with the compound represented by Formula (A) above is especially preferred.

(Layer Forming Step)

In the layer forming step, a curable layer is formed by applying a curable pigment composition containing (A) the organosilane compound represented by Formula (I), (B) a photopolymerization initiator, (C) a compound having an ethylenically unsaturated double bond, and (D) a pigment to the adhesion auxiliary agent-applied surface of the inorganic material whereto the adhesion auxiliary agent was applied in the aforementioned adhesion treatment step.

Methods such as coating, inkjet application, printing, vapor deposition, and the like can be listed as methods for applying the curable pigment composition to the inorganic material. The details thereof are the same as those discussed in the aforementioned adhesion treatment step.

The applied film thickness of curable pigment composition is preferably from about 0.1 to about 5 μm, more preferably from about 0.2 to about 3 μm, and even more preferably from about 0.2 to about 1 μm. Keeping the film thickness within the aforementioned range is effective from the viewpoint of forming a color pattern with excellent adhesion.

Drying of the curable layer formed on the inorganic material (pre-bake) may be performed using a hot plate, oven, and the like by heating at a temperature of from about 50 to about 140° C. for about 10 to about 300 seconds.

The details of the curable pigment composition including (A) the organosilane compound represented by Formula (I), (B) a photopolymerization initiator, (C) a compound having an ethylenically unsaturated double bond, and (D) a pigment are described below.

(Exposure Step)

In the exposure step, the curable layer formed in the aforementioned layer forming step is exposed to light in a pattern via a mask (pattern exposure). A latent image may be formed on the curable layer by the pattern exposure.

Exposure may be performed using a mask having the given mask pattern, the layer may be irradiated in the pattern with the emitted radiation which passes through the mask.

Ultraviolet rays such as the g-ray, the i-ray and the like are preferred as radioactive ray that can be used for exposure.

The irradiance level during exposure is preferably from about 5 to about 1500 mJ/cm$^2$, more preferably from about 10 to about 1000 mJ/cm$^2$, and most preferably from about 10 to about 500 mJ/cm$^2$.

(Development Step)

In the development step, the curable layer is developed after exposure in the aforementioned exposure step to form a color pattern. The latent image formed in the aforementioned exposure step may be visualized thereby. The color pattern is constituted by color pixels including red, green, and blue (RGB), which constitute the color filter.

After exposure in the aforementioned exposure step, only the exposed regions of the curable layer are cured, and the unexposed regions are developed with a developer. At this time, the uncured parts, i.e., the unexposed regions, are dissolved in an aqueous alkaline solution, and only the cured parts, i.e., the exposed regions, remain. In this manner a color patterned film (color filter film) constituted by color pixels (for example, 3- or 4-colors pixels) is formed.

An organic alkaline developer is suitable as the developer, and one that does not damage the circuits of the inorganic material is preferred. The development temperature is normally from about 20 to about 30° C., and the development time is from about 20 to about 90 seconds.

Examples of the alkaline chemicals used in the preparation of the developer include organic alkaline compounds such as ammonia water, ethylamine, diethylamine, dimethyl ethanolamine, tetramethylammonium hydroxide, tetraethylammonium hydroxide, choline, pyrrole, piperidine, and 1,8-diazabicyclo-[5,4,0]-7-undecene and the like.

For the developer, an aqueous alkaline solution diluted with pure water so that the concentration of the aforementioned alkaline chemicals are from about 0.001 to about 10% by mass, and preferably from about 0.01 to about 1% by mass, is preferably used.

When such an aqueous alkaline solution is used as the developer, a cleaning (rinse) is generally performed with pure water after development.

Following the aforementioned adhesion treatment step, layer forming step, exposure step, and development step, a curing step in which the formed color pattern is cured by heating and/or exposure to light may also be included in the present invention as necessary.

As a curing step, it is preferable to perform a heat treatment (post-bake) after rinsing to remove excess developer and drying. A post-bake is a heat treatment after the development to make the curing complete, and the heating treatment is normally performed at about 100 to about 240° C. Within the aforementioned temperature range, a temperature of from about 200 to about 240° C. is preferred.

The post-bake after the curable layer is developed may be performed by continuous or batch method using a heating unit such as a hot plate, a convection oven (hot air circulation dryer), an ultrasonic heater, and the like under the above conditions.

As mentioned above, a color filter constituting a cured pattern of given color tones may be manufactured by sequentially repeating the previously described steps for each color for only the number of given color tones.

(Curable Pigment Composition)

Next, each component for forming the curable pigment composition is described in detail.

The curable pigment composition of the present invention contains at least (A) the organosilane compound represented by Formula (I) shown below (hereinafter, also referred to as the "specific organosilane compound"), (B) a photopolymerization initiator, (C) a compound having an ethylenically unsaturated double bond, and (D) a pigment. As necessary, the composition may also be constituted using other components such as dispersant, sensitizer, binder polymer, and the like.

(A) Organosilane Compound Represented by Formula (I)

The curable pigment composition of the present invention includes at least one type of organosilane compound represented by Formula (I) below (specific organosilane compound). By including the specific organosilane compound, a high level of adhesion is obtained to the aforementioned inorganic material to which the adhesion auxiliary agent has been applied. In addition, the curable pigment composition exhibits good development in the unexposed state and the development residue may be suppressed.

Formula (I)

In Formula (I), L represents a monovalent organic group; $R^1$ and $R^2$ each independently represent hydrocarbon groups; and n represents an integer of 1 to 3.

Examples of the monovalent organic group represented by L include an optionally substituted alkyl group, alkenyl group, aryl group, alkoxy group, amino group, or combination thereof having 1 or more carbon atoms. Among these alternatives, an optionally substituted alkyl group of 1 to 20 carbon atoms is preferred.

Examples of the hydrocarbon group represented by R¹ and R² include straight chain, branched, or cyclic alkyl groups (e.g., methyl group, ethyl group, propyl group, isopropyl group, butyl group, isobutyl group, pentyl group, hexyl group, cyclohexyl group and phenyl group) and the like. Among these alternatives, R¹ and R² are preferably a straight chain, branched, or cyclic alkyl group of 1 to 12 carbon atoms, more preferably a straight chain alkyl group of 1 to 6 carbon atoms, and methyl and ethyl groups are especially preferred.

In addition, n represents an integer of 1 to 3, and from the viewpoints of stability and adhesiveness, an integer of 2 or 3 is preferred.

The organosilane compound of the present invention is preferably a compound having at least one hydrophilic moiety in its molecule, and more preferably one having plural hydrophilic moieties therein. When the plural hydrophilic moieties are present in the molecule, the hydrophilic moieties may be the same or different.

Among the organosilane compounds represented by Formula (I) above, the organosilane compounds represented by Formula (II) below is preferred from the viewpoints of curability and of removability when developing and removing the parts other than the cured parts after curing. In other words, the above organosilane compound is an organosilane compound having a monovalent organic group containing a hydrophilic moiety.

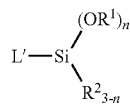

Formula (II)

In Formula (II) above, L' represents a monovalent organic group containing a hydrophilic moiety.

R¹ and R² each independently represent a hydrocarbon group, and are the same as R¹ and R² of Formula (I). The details of the hydrocarbon groups represented by R¹ and R², and their preferred embodiments are the same as in Formula (I).

In addition, n represents an integer of 1 to 3, and from the viewpoint of stability and adhesiveness, an integer of 2 or 3 is preferred.

The "monovalent organic group containing a hydrophilic moiety" represented by L' is explained below.

The "hydrophilic moiety" contained in the monovalent organic group L' represents a polar atomic group which shows high affinity with a highly polar material as represented by water and includes, for example, atoms such as oxygen, nitrogen, sulfur, phosphorus, and the like. Examples of such a hydrophilic moiety include moieties capable of a dipole-dipole interaction, dipole-ion interaction, ion bond, hydrogen bond, and the like with a highly polar material as represented by water.

Examples of a hydrophilic moiety include polar groups and dissociable groups containing an atom such as oxygen, nitrogen, sulfur, and the like; a hydrogen bond donor; hydrogen bond acceptor; and a moiety having plurality of a lone pair of electrons that may assemble and provide a hydrophilic field. More specifically, examples include hydrophilic groups such as a hydroxyl group, amino group, carbonyl group, thiocarbonyl group, mercapto group, carbamoyl group, carbamoy-loxy group, and carbamoyl amino group, etc.; sulfonamide moiety, urethane moiety, thiourethane moiety, amide moiety, ester moiety, thioether moiety, urea moiety, thiourea moiety, oxycarbonyloxy moiety, ammonium group, secondary amine moiety, tertiary amine moiety, polyethyleneoxy moiety represented by —(CH₂CH₂O)ₐ— (in which a is an integer of 2 or more); and the partial structures represented by the following structural formulae (monovalent to trivalent hydrophilic moieties), and the like.

Monovalent hydrophilic moieties

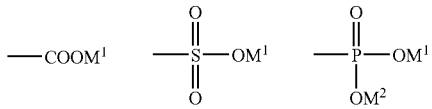

Divalent hydrophilic moieties

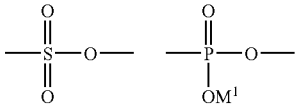

Trivalent hydrophilic moieties

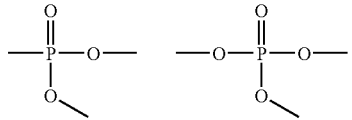

In the above structural formulae, M¹ and M² each independently represent a hydrogen atom or monovalent metal atom (e.g. lithium, sodium, potassium, etc.).

Among above hydrophilic moieties, a structure is preferred that does not undergo a Michael addition reaction with the ethylenically unsaturated double bond of "(C) compound having an ethylenically unsaturated double bond" described below from the viewpoint of stability over time of the curable pigment composition. With this in mind, preferred moieties are a hydroxyl group, carbonyl group, thiocarbonyl group, carbamoyl group, carbamoyloxy group, carbamoyl amino group, urethane moiety, thiourethane moiety, amide moiety, ester moiety, thioether moiety, urea moiety, thiourea moiety, oxycarbonyloxy moiety, ammonium group, tertiary amine moiety, polyethyleneoxy moiety represented by —(CH₂CH₂O)ₐ— (in which a is an integer of 2 or more), oxycarbonyloxy moiety, and the partial structure represented by the above structural formulae (monovalent to trivalent hydrophilic moieties).

In the case of the —Si(OR¹)ₙR²₃₋ₙ partial structure of Formula (II) above undergoes a hydrolysis reaction, it may become a cause of thickening of the curable composition with the passage of time. From the viewpoint of difficulty in inducing a foregoing hydrolysis reaction, among the hydrophilic moieties, the hydroxyl group, carbonyl group, thiocarbonyl group, urethane moiety, thiourethane moiety, amide moiety, ester moiety, thioether moiety, carbamoyl group, carbamoyloxy group, carbamoylamino group, urea moiety, thiourea moiety, tertiary amine moiety, and polyethyleneoxy moiety are preferred; the hydroxyl group, urethane moiety, thiourethane moiety, amide moiety, sulfonamide moiety, ester moiety, urea moiety, thiourea moiety, tertiary amine moiety, and polyethyleneoxy moiety are more preferred; and the hydroxyl group, urethane moiety, thiourethane moiety, urea moiety, tertiamine moiety, and polyethyleneoxy moiety represented by —(CH₂CH₂O)ₐ— (wherein a is an integer of 2 or more) are most preferred.

Among the specific organosilane compounds, the compounds represented by Formula (III) and formula (IV) below are especially preferred.

(Organosilane Compound Represented by Formula (III))

Formula (III)

In Formula (III) above, $R^{11}$ and $R^{12}$ each independently represent a hydrocarbon group of 1 to 6 carbon atoms. Examples of the hydrocarbon of 1 to 6 carbon atoms represented by $R^{11}$ and $R^{12}$ include a straight chain, branched, or cyclic alkyl group of 1 to 6 carbon atoms (e.g., methyl group, ethyl group, propyl group, isopropyl group, butyl group, isobutyl group, pentyl group, hexyl group, cyclohexyl group, and phenyl group) and the like. Among these alternatives, $R^{11}$ and $R^{12}$ are preferably methyl and ethyl groups.

$R^3$ represents divalent hydrocarbon group of 1 to 12 carbon atoms, and the hydrocarbon group may be unsubstituted or substituted. In addition, the hydrocarbon structure of the hydrocarbon group may have a cyclic structure and/or unsaturated bond(s). Furthermore, the hydrocarbon structure may have a monovalent hydrophilic moiety. Herein, the hydrophilic moiety refers to those structures described as monovalent hydrophilic moieties in the description of L' above, and the preferred examples thereof are also the same.

A detailed description of divalent hydrocarbon groups represented by $R^3$ is presented below.

X represents a monovalent hydrophilic moiety. Herein, the hydrophilic moiety refers to those structures described as monovalent hydrophilic moieties in the description of L' above, and the preferred examples thereof are also the same.

In the above formula, n represents an integer of 1 to 3, and from the viewpoint of stability and adhesiveness, n is preferably 2 or 3.

(Organosilane Compound Represented by Formula (IV))

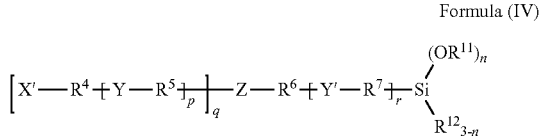

Formula (IV)

In Formula (IV) above, $R^{11}$ and $R^{12}$ each independently represent a hydrocarbon group of 1 to 6 carbon atoms. Examples of the hydrocarbon group of 1 to 6 carbon atoms represented by $R^{11}$ and $R^{12}$ include a straight chain, branched, or cyclic alkyl group of 1 to 6 carbon atoms (e.g., methyl group, ethyl group, propyl group, isopropyl group, butyl group, isobutyl group, pentyl group, hexyl group, cyclohexyl group, and phenyl group) and the like. Among these alternatives, $R^{11}$ and $R^{12}$ are preferably methyl and ethyl groups.

$R^4$, $R^5$, $R^6$, and $R^7$ each independently represent a single bond, unsubstituted or an optionally substituted hydrocarbon chain of 1 to 12 carbon atoms (divalent hydrocarbon group). When $R^4$, $R^5$, $R^6$, and $R^7$ represent a hydrocarbon chain (divalent hydrocarbon group), the structure thereof may have a cyclic structure and/or unsaturated bond(s). Furthermore, the hydrocarbon chain (divalent hydrocarbon group) may have a monovalent hydrophilic moiety as a substituent group thereof.

A detailed description of the divalent hydrocarbon groups represented by $R^4$ to $R^7$ is presented below.

X' represents a hydrogen atom or a monovalent substituent group, and the monovalent substituent may optionally include a hydrophilic moiety. Herein, the term hydrophilic moiety refers to those structures described as monovalent hydrophilic moieties in the description of L' above, and the preferred examples thereof are also the same.

Y and Y' each independently represent a divalent hydrophilic moiety, and Z represents a divalent or trivalent hydrophilic moiety depending on the value of q, which is either 1 or 2. In other words, when q is 1, Z represents a divalent hydrophilic moiety, and when q is 2, Z represents a trivalent hydrophilic moiety. Among the hydrophilic moieties described in Formula (I) or Formula (II) above, divalent or trivalent hydrophilic moieties are the same structures as exemplified as divalent or trivalent hydrophilic moieties.

In the formula p represents an integer of 0 to 20, r represents an integer of 0 to 3, and n represents an integer of 1 to 3.

In the case of $R^3$ of Formula (III) or $R^4$, $R^5$, $R^6$, and $R^7$ of Formula (IV) is a divalent hydrocarbon group, it is preferably an alkyl or aromatic group with a straight chain, branched, or cyclic structure that may have substituents.

Examples of substituents that can be introduced onto the divalent hydrocarbon group include an aliphatic group, aromatic group, heterocyclic group, halogen atom, cyano group, nitro group, aliphatic oxy group, aromatic oxy group, heterocyclic oxy group, and hydrophilic group; and among these alternatives, an aliphatic group of 1 to 12 carbon atoms, aromatic group, heterocyclic group, chlorine atom, cyano group, and hydrophilic group are preferred.

Suitable examples of the aliphatic group of 1 to 12 carbon atoms include a methyl group, ethyl group, propyl group, isopropyl group, butyl group, isobutyl group, pentyl group, hexyl group, cyclohexyl group, octyl group and the like; and among these alternatives, a methyl group, ethyl group, and propyl group are preferred.

Examples of the aromatic group include a phenyl group, naphthyl group and anthracene group, and among these alternatives, a phenyl group is preferred.

Examples of the heterocyclic group include a morpholino group, tetrahydrofurfuryl group, pyrrolyl group, furyl group, thiophenyl group, benzopyrrolyl group, benzofuryl group, benzothiophenyl group, pyrazolyl group, isoxazolyl group, isothiazolyl group, indazolyl group, benzoisoxazolyl group, benzoisothiazolyl group, imidazolyl group, oxazolyl group, thiazolyl group, benzimidazolyl group, benzoxazolyl group, benzothiazolyl group, pyridyl group, quinolinyl group, isoquinolinyl group pyridazinyl group, pyrimidinyl group, pyrazinyl group, cinnolinyl group, phthalazinyl group, quinazolinyl group, quinoxalinyl group, acridinyl group, phenanthridinyl group, phthaladinyl group, carbazoylyl group, carbolinyl group, purinyl group, triazolyl group, oxadiazolyl group, and thiadiazolyl group; and among these a morpholino group, tetrahydrofurfuryl group and pyridyl group are preferred.

Examples of the hydrophilic group include a hydroxyl group, amino group, carbonyl group, thiocarbonyl group, mercapto group, carbamoyl group, carbamoyloxy group, carbamoylamino group and the like; and among these a hydroxyl group, carbonyl group, and amino group are preferred.

Examples of the "monovalent hydrophilic moiety" that may be present therein when $R^3$ of Formula (III) or $R^4$, $R^5$, $R^6$, and $R^7$ of Formula (IV) represent a divalent hydrocarbon group include a hydroxyl group, amino group, mercapto group, ammonium group, carbamoyl group, carbamoyloxy group, carbamoylamino group and the partial structure represented by the following structural formulae (wherein $M^1$ and $M^2$ are as mentioned above).

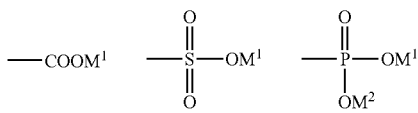

Among the above alternatives, the "divalent hydrocarbon group" represented by $R^3$ of Formula (III) above is preferably a methylene chain of 1 to 5 carbon atoms or an optionally substituted methylene chain (more preferably, a methylene chain of 3 carbon atoms) that may contain an oxygen atom in the chain thereof.

The "divalent hydrocarbon group" represented by $R^4$ to $R^7$ of Formula (IV) above is preferably a methylene chain of 1 to 5 carbon atoms or an optionally substituted methylene chain (more preferably, a methylene chain of 3 carbon atoms) that may contain an oxygen atom in the chain thereof.

Preferred examples of the monovalent hydrophilic moiety in X of Formula (III) or X' of Formula (IV) include a hydroxyl group, amino group, mercapto group, ammonium group, carbamoyl group, carbamoyloxy group, carbamoylamino group and the partial structure represented by the following structural formulae (wherein $M^1$ and $M^2$ are as mentioned above).

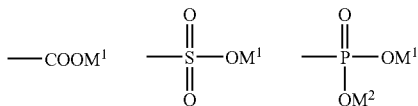

If Y, Y', or Z of Formula (IV) is a divalent hydrophilic moiety, preferred examples include a carbonyl group, thiocarbonyl group, urethane moiety, thiourethane moiety, amide moiety, ester moiety, thioether moiety, sulfonamide moiety, urea moiety, thiourea moiety, secondary amine moiety, polyethyleneoxy moiety represented by $-(CH_2CH_2O)_a-$ (wherein a is an integer of 2 or more), oxycarbonyloxy moiety, and the partial structures represented by the following structural formulae (wherein $M^1$ is as mentioned above), and the like.

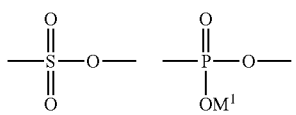

In the case of Z of Formula (IV) is a trivalent hydrophilic moiety, preferred examples include a tertiary amine moiety, urea moiety, thiourea moiety, the partial structures represented by the following structural formulae, and the like.

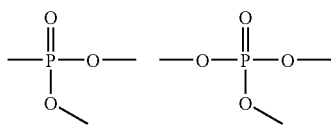

Among the compounds represented by Formula (III) above, the preferred compound is one wherein $R^{11}$ and $R^{12}$ are methyl and ethyl groups; $R^3$ is a methylene chain of 1 to 5 carbon atoms or an optionally having substituted methylene chain (more preferably, a methylene chain of 3 carbon atoms) that may contain an oxygen atom in the chain thereof; X is an amino group; and n is 2 to 3 (more preferably 2).

Among the compounds represented by Formula (IV) above, the preferred compound is one wherein $R^{11}$ and $R^{12}$ are methyl or ethyl groups; $R^4$ and $R^5$ are preferably methylene chains of 1 to 5 carbon atoms (more preferably methylene chains of 2 carbon atoms), $R^6$ and $R^7$ are preferably methylene chains of 1 to 5 carbon atoms (more preferably methylene chains of 3 carbon atoms); X' is an amino group; Y, Y' and Z are amino groups; p is 0; q is 1; r is 0, and n is 2 to 3 (more preferably 2).

Below are presented concrete examples of the specific organosilane compound represented by Formulae (I) to (IV) above. However, the present invention is not limited to these examples.

Examples of the organosilane compound represented by formula (I) above include β-(3,4-epoxycyclohexyl)ethyl trimethoxy silane; γ-glycidoxy propyl trimethoxy silane; γ-glycidoxy propyl triethoxy silane; methyl trimethoxy silane; methyl triethoxy silane; vinyl triacetoxy silane; γ-chloro propyl trimethoxy silane; vinyl trimethoxy silane; vinyl triethoxy silane; γ-chloro propylmethyl dimethoxy silane; trimethyl chlorosilane; 2-(3,4-epoxycyclohexyl)ethyl trimethoxy silane; bisaryl trimethoxy silane; tetraethoxy silane; bis(trimethoxysilyl)hexane; phenyl trimethoxy silane; and the like.

Even more preferred concrete examples of the organosilane compounds represented by Formulae (II), (III) and (IV) above are shown below (Example Compounds (1) to (145)).

(1)

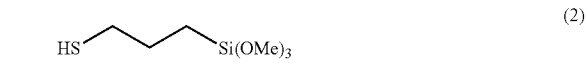

(2)

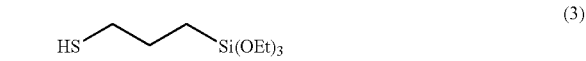

(3)

(4)

(5)

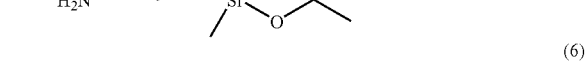

(6)

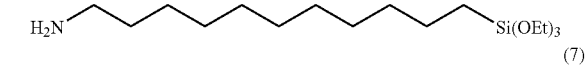

(7)

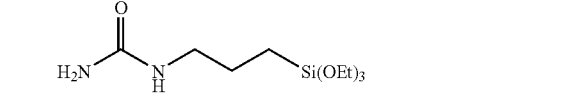

(8)

(9)

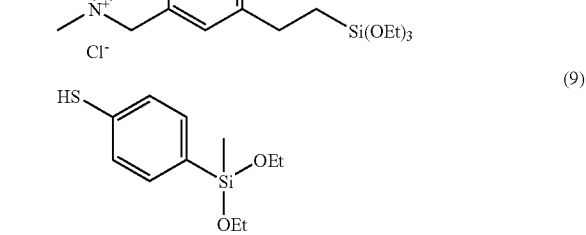

(10)
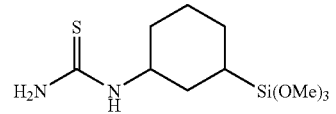
(11)
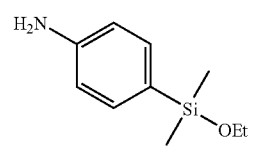
(12)
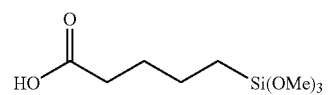
(13)
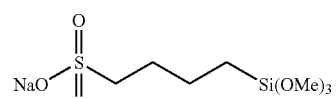
(14)
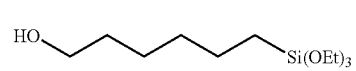
(15)
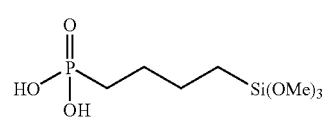
(16)
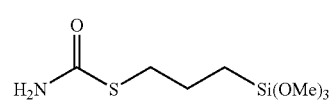
(17)
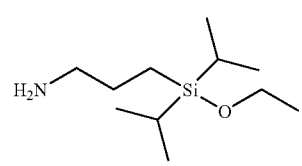
(18)
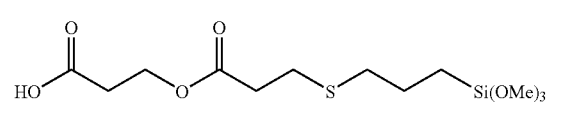
(19)
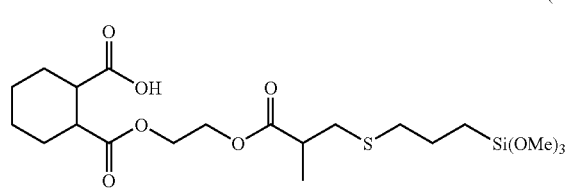
(20)
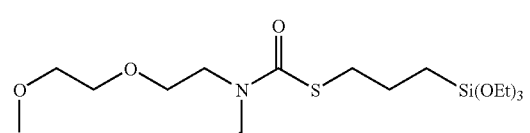
(21)
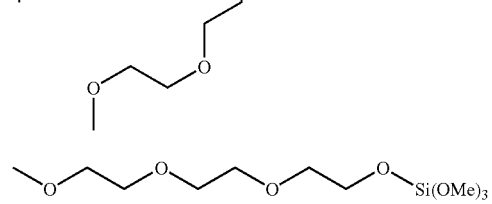
(22)
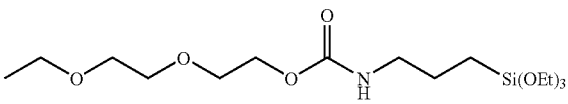
(23)
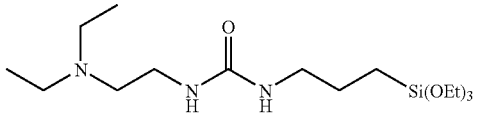
(24)
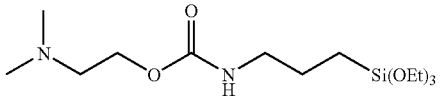
(25)
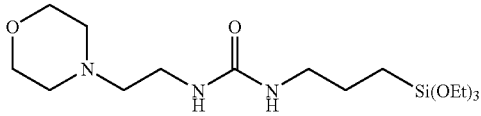
(26)
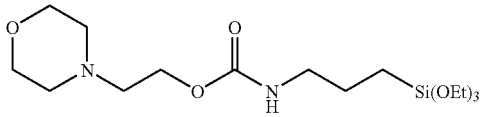
(27)
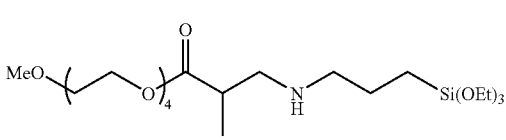
(28)
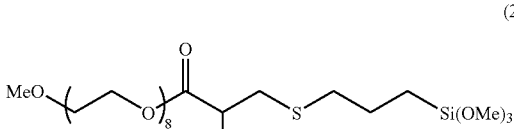
(29)
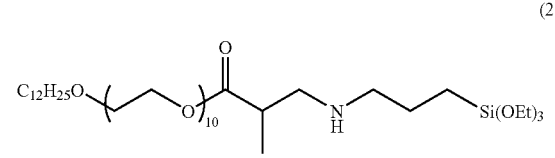
(30)
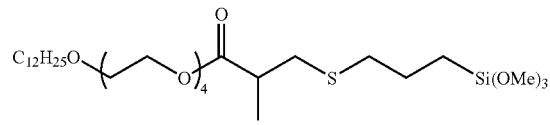
(31)
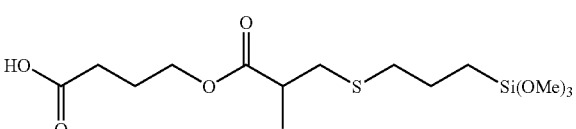
(32)
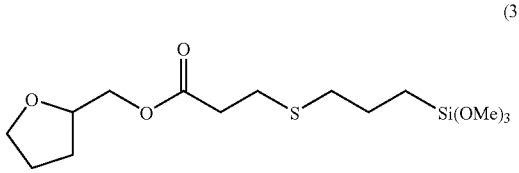

(33) 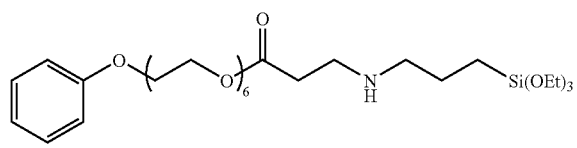
(34) 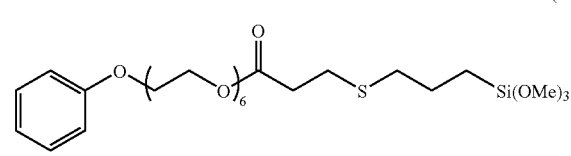
(35) 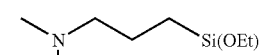
(36) 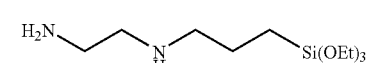
(37) 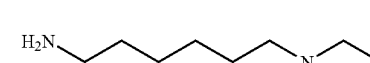
(38) 
(39) 
(40) 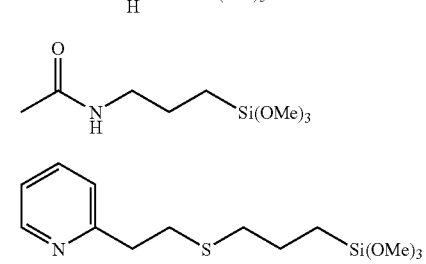
(41) 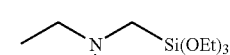
(42) 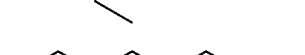
(43) 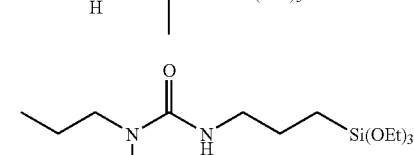
(44) 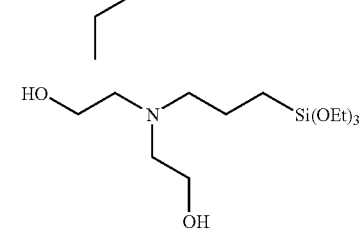
(45) 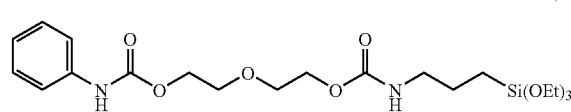
(46) 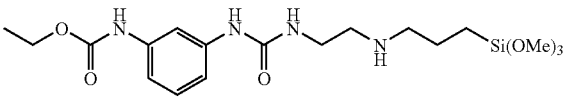
(47) 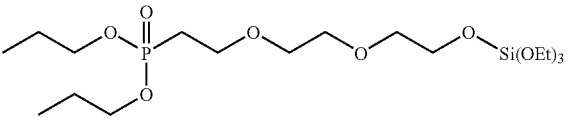
(48) 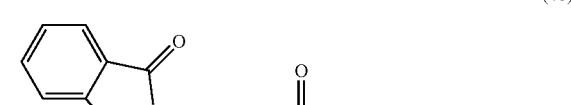
(49) 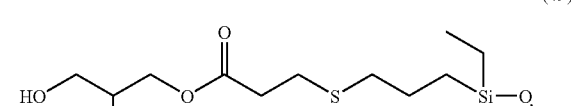
(50) 
(51) 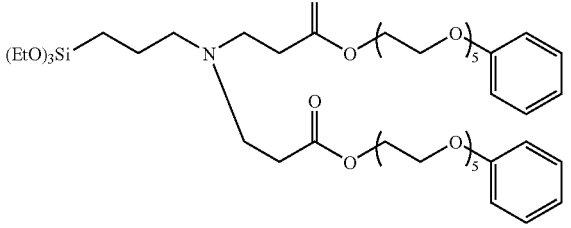
(52) 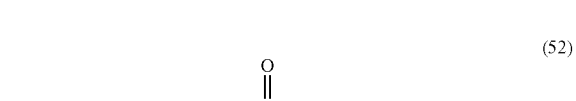
(54) 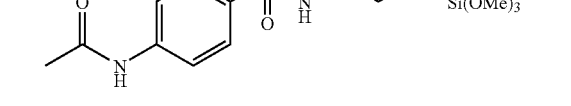

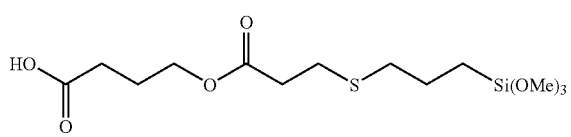
(55)
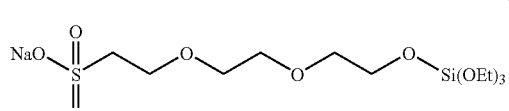
(56)
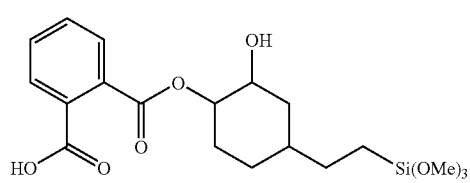
(57)
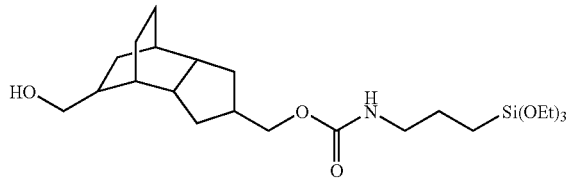
(58)
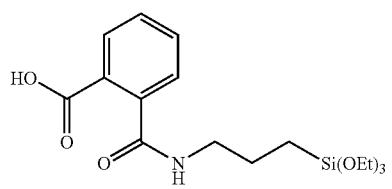
(59)
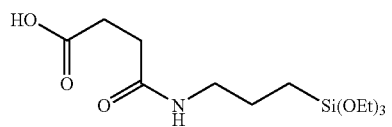
(60)
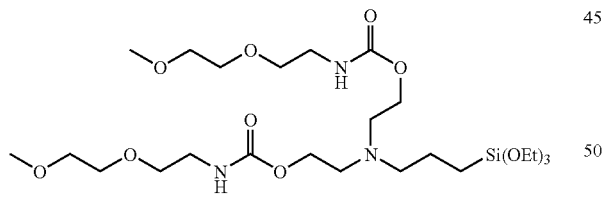
(61)
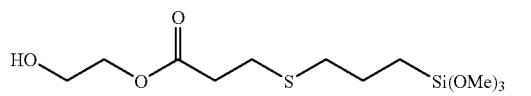
(62)
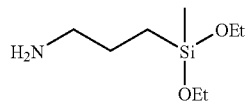
(63)
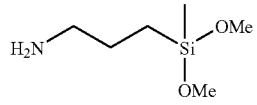
(64)
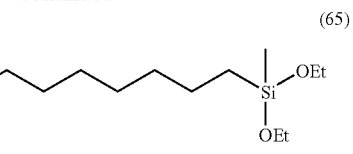
(65)
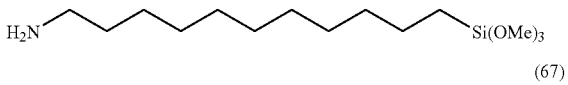
(66)
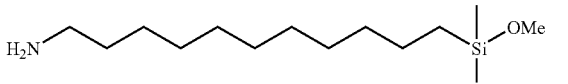
(67)
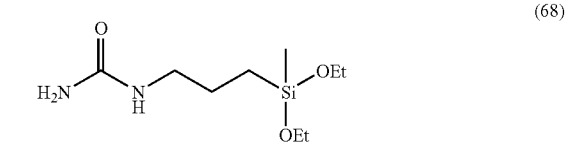
(68)
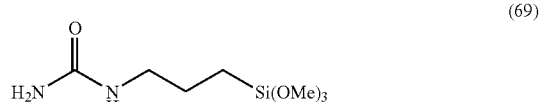
(69)
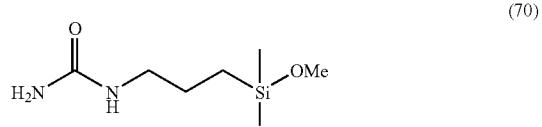
(70)
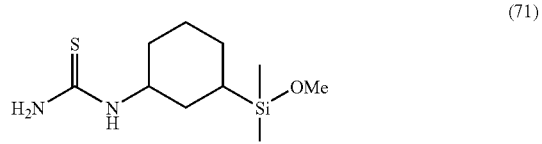
(71)
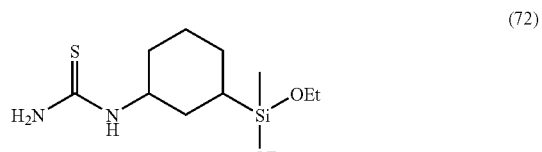
(72)
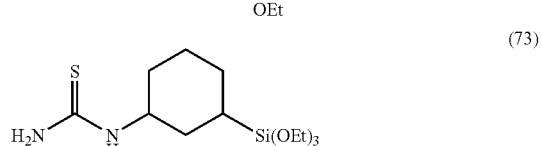
(73)
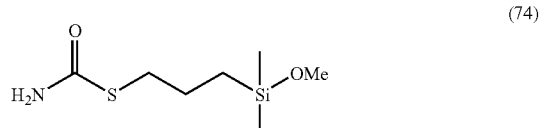
(74)
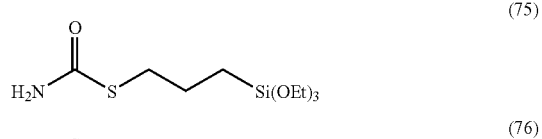
(75)
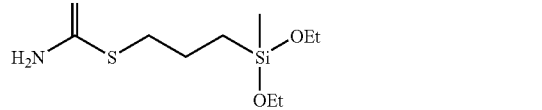
(76)

(77) 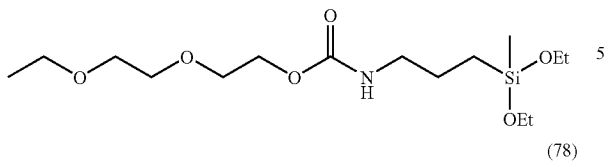
(78) 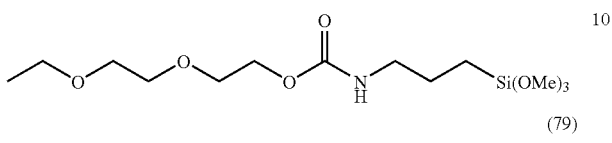
(79) 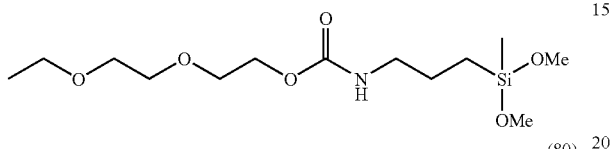
(80) 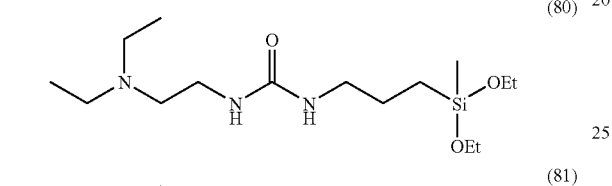
(81) 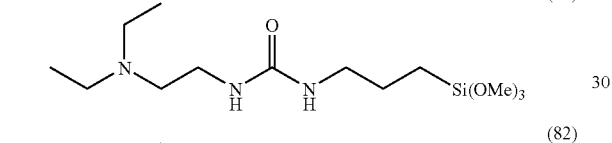
(82) 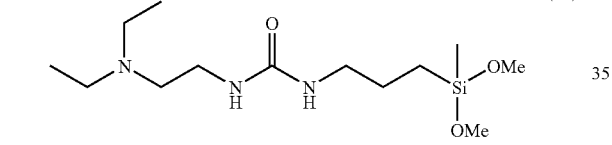
(83) 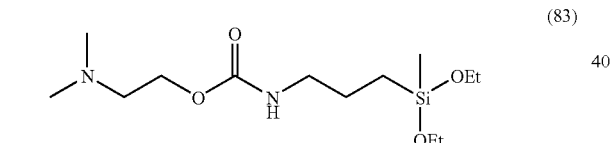
(84) 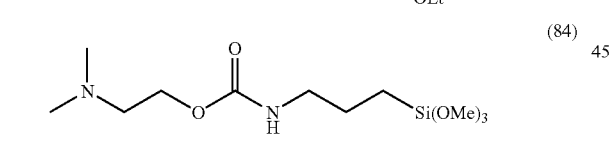
(85) 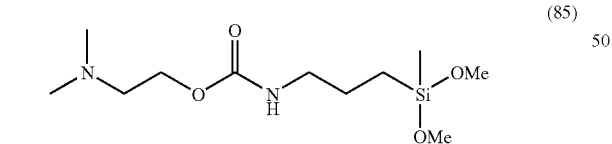
(86) 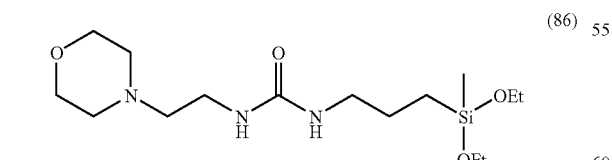
(87) 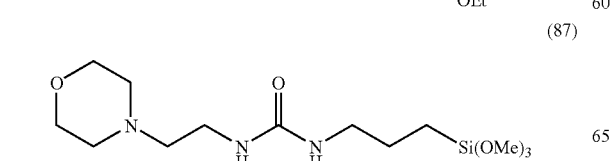
(88) 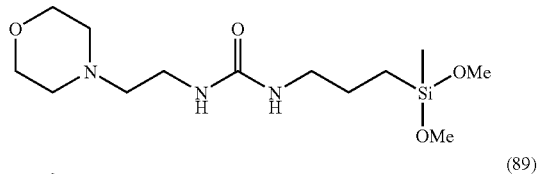
(89) 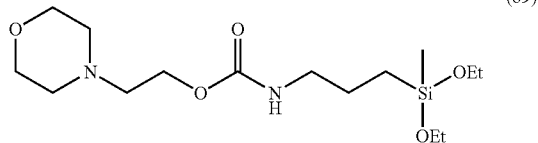
(90) 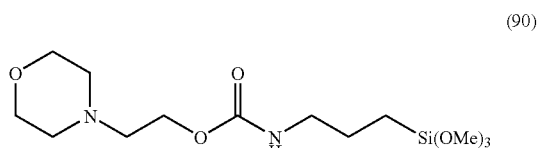
(91) 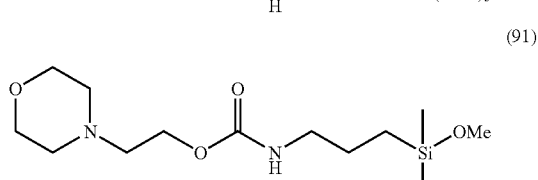
(92) 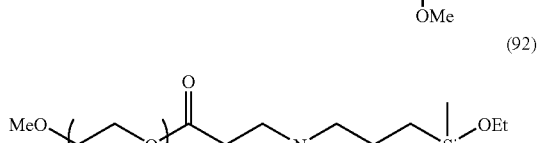
(93) 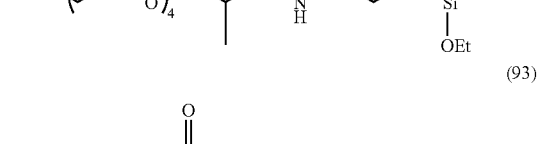
(94) 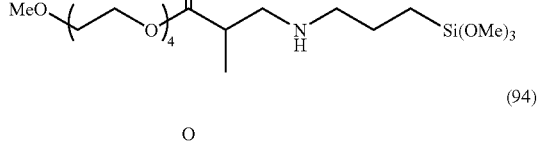
(95) 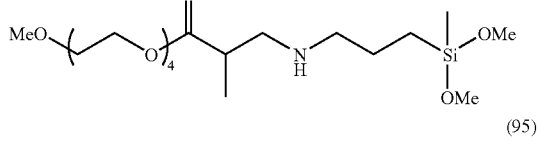
(96) 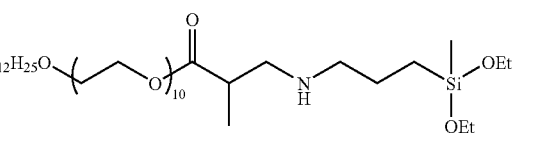
(97) 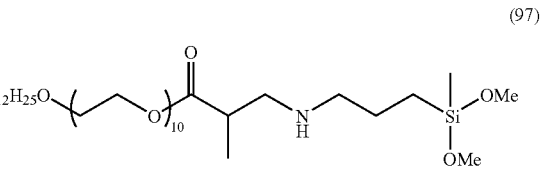

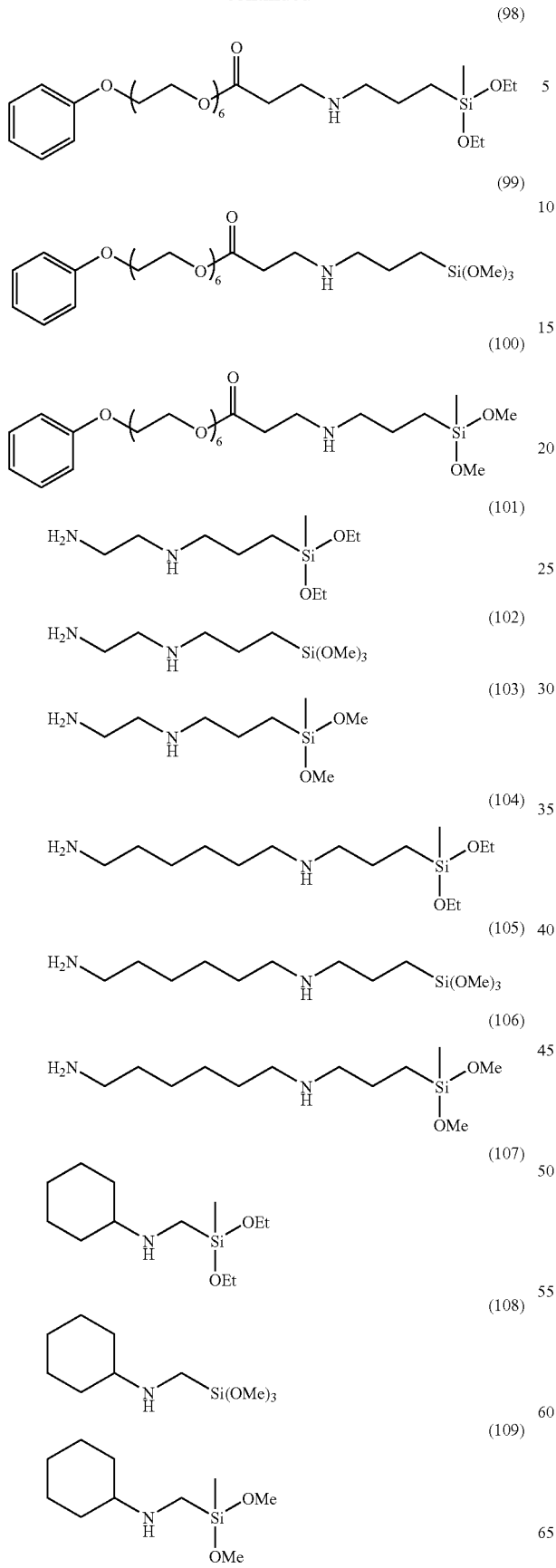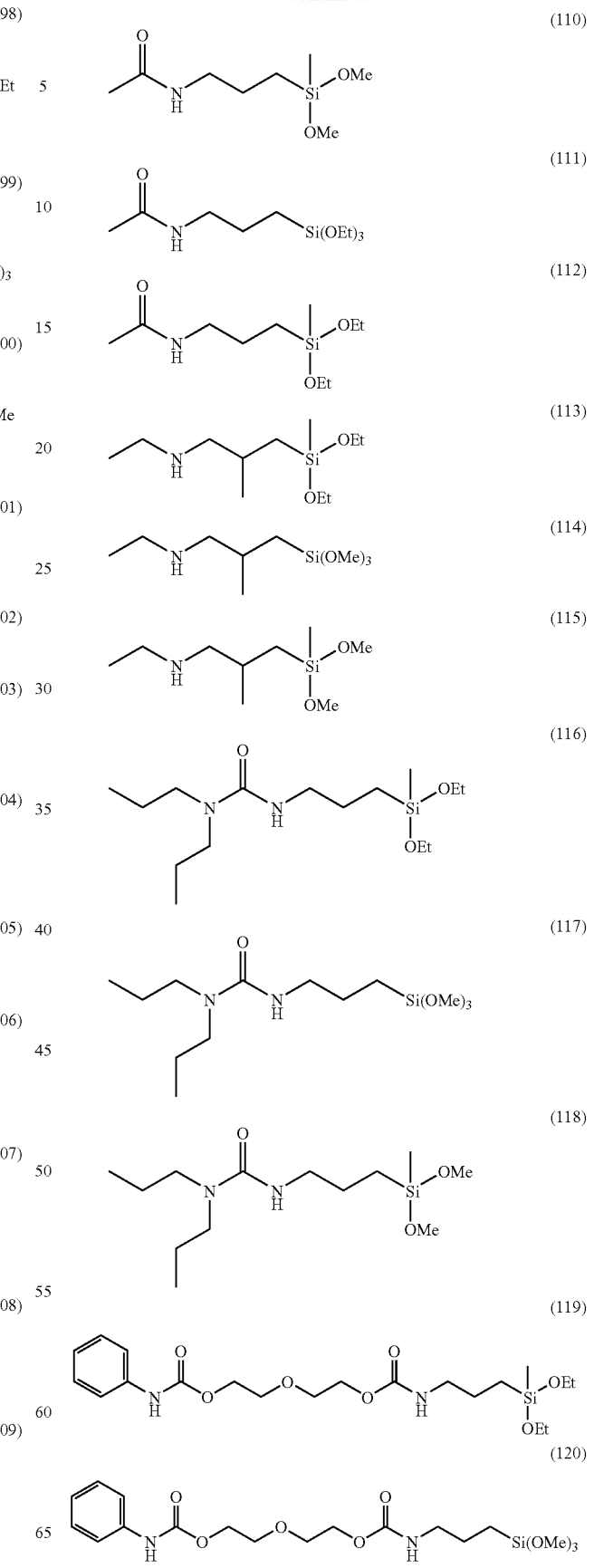

(121) 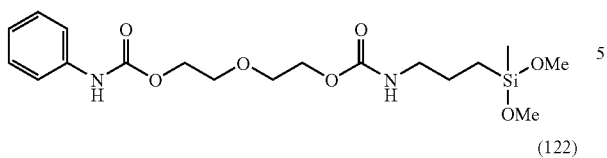
(122) 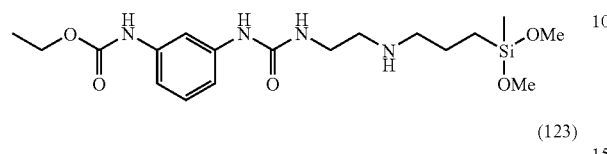
(123) 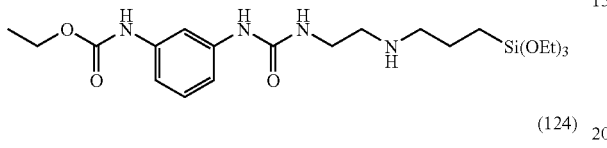
(124) 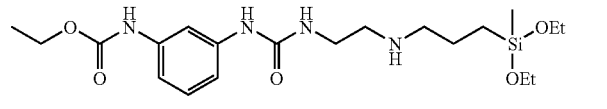
(125) 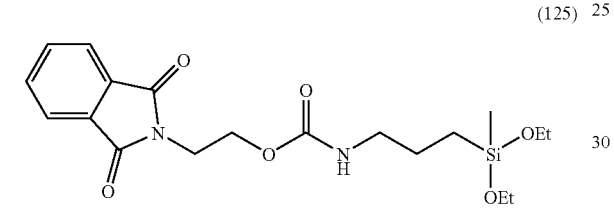
(126) 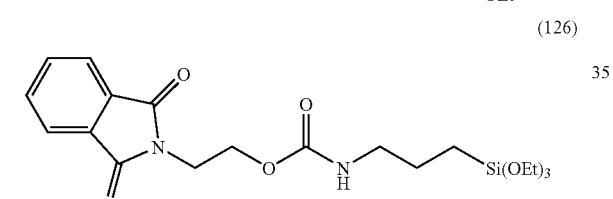
(127) 
(128) 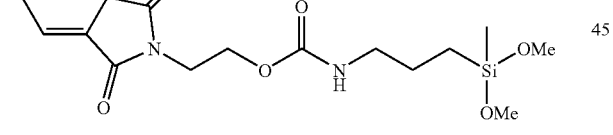
(129) 
(130) 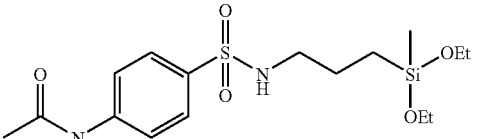
(131) 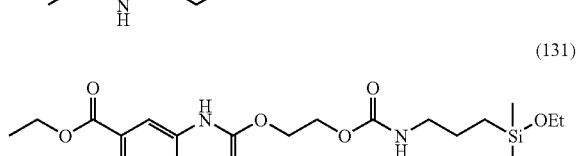
(132) 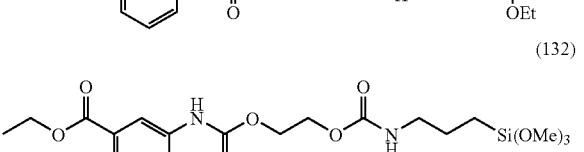
(133) 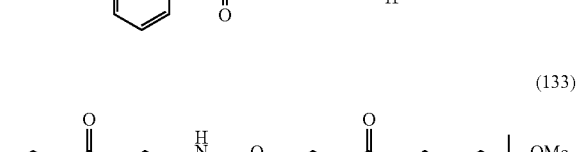
(134) 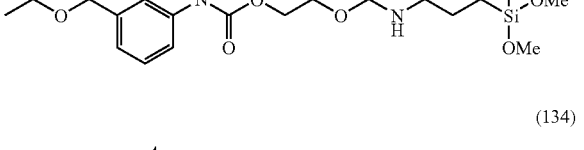
(135) 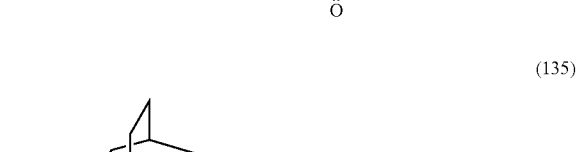
(136) 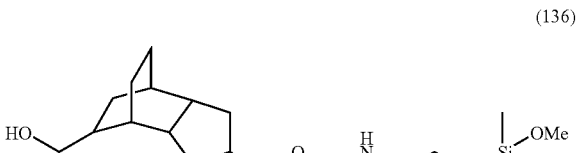
(137) 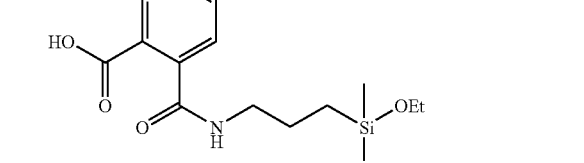

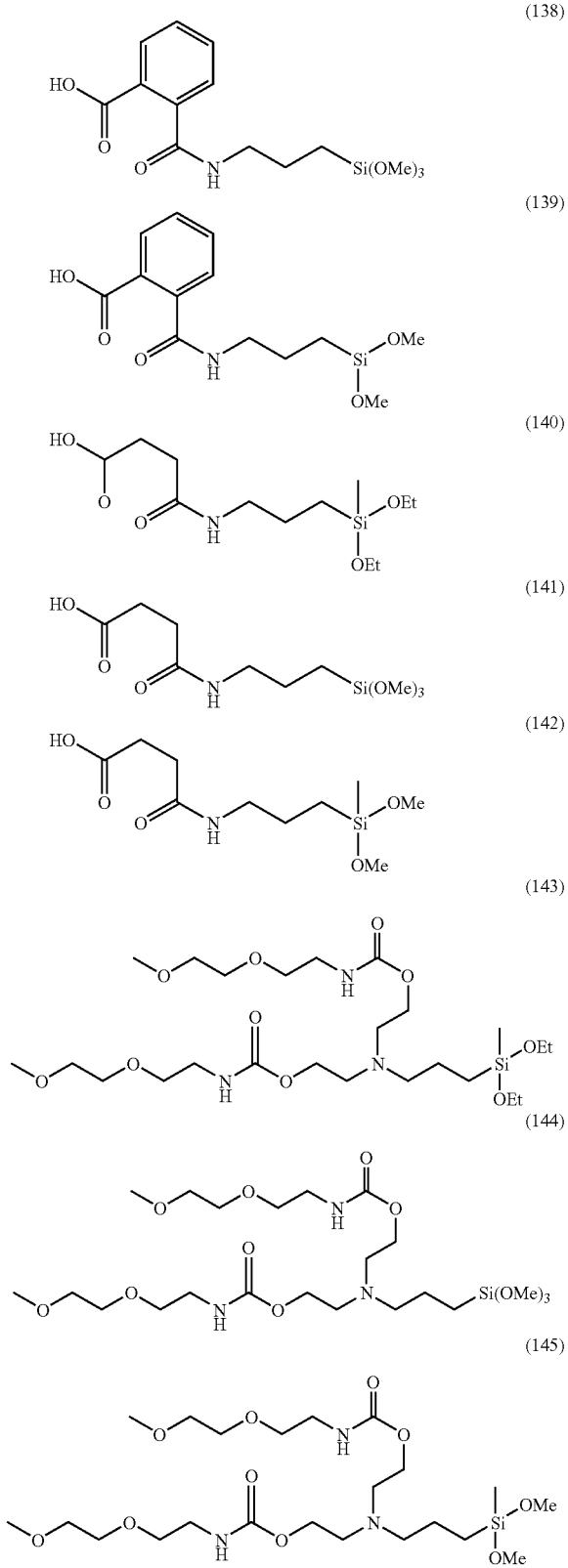

As the content of the specific organosilane compound in the curable pigment composition of the present invention, from about 0.1 to about 5.0% by mass is preferred, from about 0.1 to about 1.0% by mass is more preferred, and from about 0.3 to about 0.8% by mass is even more preferred. When the content of the specific organosilane compound lies within the above range, a color pattern with excellent adhesion to the surface of the inorganic substrate may be formed without worsening the development residue in the regions to be developed and removed.

(B) Photopolymerization Initiator

The curable pigment composition of the present invention contains at least one type of photopolymerization initiator.

The photopolymerization initiator is preferably a compound that is degraded by light, and subsequently initiates and promotes the polymerization of "(C) a compound having an ethylenically unsaturated double bond" to be described below, and having absorption in the region of wavelength 300 to 500 nm. In addition, the photopolymerization initiator may be used alone, or two or more types thereof may be used in combination.

Examples of the photopolymerization initiator include organic halide compounds, oxydiazole compounds, carbonyl compounds, ketal compounds, benzoin compounds, acridine compounds, organic peroxide compounds, azo compounds, cumarin compounds, azide compounds, metallocene compounds, hexaaryl biimidazole compounds, organic borate compounds, disulfone compounds, oxime ester compounds, onium salt compounds and acyl phosphine (oxide) compounds.

These compounds are described in detail below.

Specific examples of organic halide compounds are shown in Wakabayashi, et al., Bull. Chem. Soc. Japan 42, 2924 (1969); the Specification of U.S. Pat. No. 3,905,815; Japanese Patent Publication No. S46-4605; Japanese Patent Application Laid-open Nos. S48-36281, S55-32070, S60-239736, S61-169835, S61-169837, S62-58241, S62-212401, S63-70243; and S63-298339 and M. P. Hutt, Journal of Heterocyclic Chemistry 1 (No. 3), 1970, and trihalomethyl-substituted oxazole compounds and s-triazine compounds are particularly worthy of mention.

More preferred examples of the s-triazine compounds include s-triazine derivatives wherein at least one mono-, di-, or tri-halomethyl group is bonded to the s-trazine ring, and specific examples thereof include 2,4,6-tris (monochloromethyl)-s-triazine; 2,4,6-tris (dichloromethyl)-s-triazine, 2,4,6-tris (trichloromethyl)-s-triazine; 2-methyl-4,6-bis(trichloromethyl)-s-triazine; 2-n-propyl-4,6-bis(trichloromethyl)-s-triazine; 2(α,α,β-trichloroethyl)-4,6-bis(trichloromethyl)-s-triazine; 2-phenyl-4,6-bis(trichloromethyl)-s-triazine; 2-(p-methoxyphenyl)-4,6-bis(trichloromethyl)-s-triazine; 2-(3,4-epoxyphenyl)-4,6-bis(trichloromethyl)-s-triazine; 2-(p-chlorophenyl)-4,6-bis(trichloromethyl)-s-triazine; 2-[1-(p-methoxyphenyl)-2,4-butadienyl]-4,6-bis(trichloromethyl)-s-triazine; 2-styryl-4,6-bis(trichloromethyl)-s-triazine; 2-(p-methoxystyryl)-4,6-bis(trichloromethyl)-s-triazine; 2-(p-I-propyloxystyryl)-4,6-bis(trichloromethyl)-s-triazine; 2-(p-tolyl)-4,6-bis(trichloromethyl)-s-triazine; 2-(4-naphthoxynaphthyl)-4,6-bis(trichloromethyl)-s-triazine; 2-phenylthio-4,6-bis(trichloromethyl)-s-triazine; 2-benzylthio-4,6-bis(trichloromethyl)-s-triazine; 2,4,6-tris (dibromomethyl)-s-triazine; 2,4,6-tris (tribromomethyl)-s-triazine; 2-methyl-4,6-bis(tribromomethyl)-s-triazine; and 2-methoxy-4,6-bis(tribromomethyl)-s-triazine.

Examples of the oxydiazole compounds include 2-trichloromethyl-5-styryl-1,3,4-oxadiazole; 2-trichloromethyl-5-(cyanostyryl)-1,3,4-oxadiazole; 2-trichloromethyl-5-(naphth-1-yl)-1,3,4-oxadizole; 2-trichloromethyl-5-(4-styryl)styryl-1,3,4-oxadizole, and the like.

Examples of the above-described carbonyl compounds include benzophenone and derivatives thereof such as Micheler's ketone, 2-methyl benzophenone, 3-methyl benzophenone, 4-methyl benzophenone, 2-chloro benzophenone, 4-bromo benzophenone and 2-carboxy benzophenone; acetophenone derivatives such as 2,2-dimethoxy-2-phenyl acetophenone, 2,2-diethoxy acetophenone, 1-hydroxy cyclohexylphenyl ketone, α-hydroxy-2-methylphenyl propanone, 1-hydroxy-1-methyl ethyl-(p-isopropylphenyl)ketone, 1-hydroxy-1-(p-dodecylphenyl)ketone, 2-methyl-(4'-(methylthio)phenyl)-2-morpholino-1-propanone and 1,1,1-trichloromethyl-(p-butylphenyl)ketone; 2-Benzyl-2-(dimethylamino)-4-morpholinobutyrophenone; thioxanthone and derivatives thereof such as 2-ethyl thioxanthone, 2-isopropyl thioxanthone, 2-chloro thioxanthone, 2,4-dimethyl thioxanthone, 2,4-diethyl thioxanthone and 2,4-diisopropyl thioxanthone, and benzoate derivatives such as ethyl p-dimethyl aminobenzoate and ethyl p-diethyl aminobenzoate.

Examples of the ketal compounds include benzyl methyl ketal, benzyl-β-methoxyethyl ethyl acetal, and the like.

Examples of the benzoin compounds include benzoin isopropyl ether, benzoin isobutyl ether, benzoin methyl ether, methyl o-benzoyl benzoate, and the like.

Examples of the acridine compounds include 9-phenyl acridine, 1,7-bis(9-acridinyl)heptane, and the like.

Examples of the above-described organic peroxide compounds include trimethyl cyclohexanone peroxide; acetyl acetone peroxide; 1,1-bis(tert-butylperoxy)-3,3,5-trimethyl cyclohexane; 1,1-bis(tert-butyl peroxy)cyclohexane; 2,2-bis(tert-butyl peroxy)butane; tert-butyl hydroperoxide; cumene hydroperoxide; diisopropylbenzene hydroperoxide; 2,5-dimethylhexane-2,5-dihydroperoxide; 1,1,3,3-tetramethylbutyl hydroperoxide; tert-butylcumyl peroxide; dicumyl peroxide; 2,5-dimethyl-2,5-di(tert-butylperoxy)hexane; 2,5-oxanoyl peroxide; succinic peroxide; benzoyl peroxide; 2,4-dichlorobenzoyl peroxide; diisopropyl peroxydicarbonate; di-2-ethylhexyl peroxydicarbonate; di-2-ethoxyethyl peroxydicarbonate; dimethoxyisopropyl peroxycarbonate; di(3-methyl-3-methoxybutyl) peroxydicarbonate; tert-butyl peroxyacetate; tert-butyl peroxypivalate; tert-butyl peroxy neodecanoate; tert-butyl peroxyoctanoate; tert-butyl peroxylaurate; tertiary carbonate; 3,3',4,4'-tetra-(t-butyl peroxycarbonyl)benzophenone; 3,3',4,4'-tetra-(t-hexyl peroxycarbonyl)benzophenone; 3,3',4,4'-tetra-(p-isopropyl cumylperoxycarbonyl)benzophenone; carbonyl di (t-butylperoxy dihydrogen diphthalate); carbonyl di(t-hexylperoxy dihydrogen diphthalate) and the like.

Examples of the azo compounds include those described in Japanese Patent Application Laid-open No. H8-108621 and the like.

Examples of the cumarin compounds include 3-methyl-5-amino-((s-triazin-2-yl)amino)-3-phenyl cumarin; 3-chloro-5-diethylamino-((s-triazin-2-yl)amino)-3-phenyl cumarin; 3-butyl-5-dimethyl amino-((s-triazin-2-yl)amino)-3-phenyl cumarin and the like.

Examples of the azide compounds include the organic azide compounds described in the Specifications of U.S. Pat. Nos. 2,848,328; 2,852,379 and 2,940,853; 2,6-bis(4-azide benzylidene)-4-ethyl cyclohexanone (BAC-E), and the like.

Examples of the metallocene compounds include various titanocene compounds described in Japanese Patent Application Laid-open Nos. S59-152396; S61-151197; S63-41484; H2-249; H2-4705 and H5-83588; such as di-cyclopentadienyl-Ti-bis-phenyl; di-cyclopentadienyl-Ti-bis-2,6-difluorophen-1-yl; di-cyclopentadienyl-Ti-bis-2,4-difluorophen-1-yl; di-cyclopentadienyl-Ti-bis-2,4,6-trifluorophen-1-yl; di-cyclopentadienyl-Ti-bis-2,3,5,6-tetrafluorophen-1-yl; di-cyclopentadienyl-Ti-bis-2,3,4,5,6-pentafluorophen-1-yl; di-methylcyclopentadienyl-Ti-bis-2,6-difluorophen-1-yl; di-methylcyclopentadienyl-Ti-bis-2,4,6-trifluorophen-1-yl; di-methylcyclopentadienyl-Ti-bis-2,3,5,6-tetrafluorophen-1-yl; di-methylcyclopentadienyl-Ti-bis-2,3,4,5,6-pentafluorophen-1-yl and iron-arene complexes described in Japanese Patent Application Laid-open Nos. H1-304453 and H1-152109.

Examples of the hexaaryl biimidazole compounds include various compounds described in the Specifications of Japanese Patent Publication H6-29285; U.S. Pat. Nos. 3,479,185; 4,311,783; and 4,622,286, and more specifically these include 2,2'-bis(o-chlorophenyl)-4,4',5,5'-tetraphenyl biimidazole; 2,2'-bis(o-bromophenyl)-4,4',5,5'-tetraphenyl biimidazole; 2,2'-bis(o, p-dichlorophenyl)-4,4',5,5'-tetraphenyl biimidazole; 2,2'-bis(o-chlorophenyl)-4,4',5,5'-tetra(m-methoxyphenyl)biimidazole; 2,2'-bis(o,o'-dichlorophenyl)-4,4',5,5'-tetraphenyl biimidazole; 2,2'-bis(o-nitrophenyl)-4,4',5,5'-tetraphenyl biimidazole; 2,2'-bis(o-methylphenyl)-4,4',5,5'-tetraphenyl biimidazole; and 2,2'-bis(o-trifluorophenyl)-4,4',5,5'-tetraphenyl biimidazole and the like.

Examples of the organic borate compounds include organic borates described in Japanese Patent Application Laid-open Nos. S62-143044, S62-150242, H9-188685, H9-188686, H9-188710, 2000-131837, 2002-107916, Japanese Patent Publication No. 2764769, Japanese Patent Application Laid-open No. 2002-116539 (Application No. 2000-310808), Kunz, Martin, "Rad Tech '98," Proceeding Apr. 19-22, 1998, Chicago, and the like; organic boron sulfonium complexes or organic boron oxosulfonium complexes described in Japanese Patent Application Laid-open Nos. H6-157623, H6-175564 and H6-175561; organic boron iodonium complexes described in Japanese Patent Application Laid-open Nos. H6-175554 and H6-175553; organic boron phosphonium complexes described in Japanese Patent Application Laid-open No. H9-188710; and organic boron transition metal-coordinate complexes described in Japanese Patent Application Laid-open Nos. H6-348011, H7-128785, H7-140589, H7-306527 and H7-292014.

Examples of the disulfone compounds include compounds described in Japanese Patent Application Laid-open Nos. S61-166544 and 2002-328465 (Application No. 2001-132318).

The oxime ester compounds are described in J. C. S. Perkin II (1979) 1653-1660; J. C. S. Perkin II (1979) 156-162; Journal of Photopolymer Science and Technology (1995) 202-232; and Japanese Patent Application Laid Open Nos. 2000-66385, 2000-80068, and National Publication of Translated Version No. 2004-534797.

Examples of the onium salt compounds include diazonium salts described in S. I. Schlesinger, Photogr. Sci. Eng., 18, 387 (1974) and T. S. Bal et al., Polymer, 21, 423 (1980); ammonium salts described in U.S. Pat. No. 4,069,055, Japanese Patent Application Laid-open No. H4-365049 and the like; phosphonium salts described in U.S. Pat. Nos. 4,069,055 and 4,069,056; and iodonium salts described in European Patent No. 104143, U.S. Pat. Nos. 339,049 and 410,201, Japanese Patent Application Laid-open Nos. H2-150848 and H2-296514.

The iodonium salts that may be most suitably used in the present inventions are diaryl iodonium salts, and from the viewpoint of stability, preferably they are substituted with 2 or more electron donor groups such as an alkyl group, alkoxy group, aryloxy group and the like.

Examples of sulfonium salts that may be most suitably used in the present invention include sulfonium salts described in the Specifications of European Patent Nos. 370, 693, 390,214, 233,567, 297,443, and 297,442, U.S. Pat. Nos. 4,933,377, 161,811, 410,201, 339,049, 4,760,013, 4,734,444, and 2,833,827, German Patent Nos. 2,904,626, 3,604,580 and 3,604,581; and from the viewpoint of stability, preferably the sulfonium salt is substituted with an electron attractive group. Preferably the Hammett value of the electron attractive group is greater than zero. Preferred electron attractive groups include a halogen atom, carboxylic acid, and the like.

As another preferred sulfonium salt, a sulfonium salt wherein one triaryl sulfonium salt substituent has a cumarin or anthraquinone structure and said salt has an absorption at 300 nm or more is preferred. [Note 3] As a different preferred sulfonium salt, a sulfonium salt wherein a triaryl sulfonium salt has an alkoxy group or arylthio group as a substituent and an absorption at 300 nm or more. As another form of a preferred sulfonium salt, an iodonium salt wherein one triaryl sulfonium salt substituent has a cumarin or anthraquinone structure and the salt has an absorption at 300 nm or more is preferred.

Additionally, as onium salt compounds, examples of selenonium salts are described in J. V. Crivello et al., Macromolecules, 10(6), 1307 (1977) and J. V. Crivello et al., J. Polymer Sci., Polymer Chem. Ed., 17, 1047 (1979); and examples of arsonium salts are described in C. S. Wen et al., Teh, Proc. Conf. Rad. Curing ASIA, p. 478, Tokyo, October (1988) and the like.

Examples of acyl phosphine (oxide) compounds are IRGACURE® 819, DAROCUR® 4265, DAROCUR® TPO and the like manufactured by Ciba Specialty Chemicals Inc.

As (B) the photopolymerization initiator used in the present invention, a compound selected from a group consisting of trihalomethyl triazine compounds, benzyl dimethyl ketal compounds, α-hydroxyketone compounds, α-aminoketone compounds, acyl phosphine compounds, phosphine oxide compounds, metallocene compounds, oxime compounds, biimidazole compounds, onium compounds, benzothiazole compounds, benzophenone compounds, acetophenone compounds and derivatives thereof, cyclopentadiene-benzene-iron complexes and salts thereof, halomethyl oxadiazole compounds, and 3-aryl-substituted cumarin compounds is preferred from the viewpoint of photosensitivity.

More preferably, the photopolymerization initiator is a trihalomethyl triazine compound, α-aminoketone compound, acyl phosphine compound, phosphine oxide compound, oxime compounds, biimidazole compound, onium compound, benzophenone compound, and acetophenone compound; and even more preferably the photopolymerization initiator is at least one type of compound selected from a group consisting of trihalomethyl triazine compounds, α-aminoketone compounds, oxime compounds, biimidazole compounds, and benzophenone compounds. Furthermore, oxime compounds are most preferred.

The content of photopolymerization initiator in the curable pigment composition with respect to the total solids in the curable composition is preferably from about 0.1 to about 50% by mass, more preferably, from about 0.5 to about 30% by mass, and a content of from about 1 to about 20% by mass is particularly preferred. When the content of photopolymerization initiator lies within the above range, excellent sensitivity and pattern forming properties are obtained.

(C) Compound Having an Ethylenically Unsaturated Double Bond

The curable pigment composition of the present invention contains at least one type of compound having an ethylenically unsaturated double bond. This "compound having an ethylenically unsaturated double bond" is an addition-polymerizable compound having at least one ethylenically unsaturated double bond, and it is acted upon by the aforementioned photopolymerization initiator, polymerizes, and hardens the curable pigment composition.

The "compound having an ethylenically unsaturated double bond" of the present invention may be selected from compounds having at least one terminal ethylenically unsaturated bond, and preferably having two or more thereof. The group of such compounds is widely known to persons skilled in the art, and such compounds may be used in the present invention without particular limitation.

The "compound having an ethylenically unsaturated double bond" includes various chemical structures such as monomer; prepolymer, (i.e., a dimer, trimer, or oligomer) or a mixture thereof; or a copolymer thereof and the like.

Examples of the monomer and copolymer thereof include unsaturated carboxylic acids (e.g., acrylic acid, methacrylic acid, itaconic acid, crotonic acid, isocrotonic acid, maleic acid, etc.) and the esters and amides thereof; preferably an ester of an unsaturated carboxylic acid and alphatic polyhydric alcohol compound, or an amide of an unsaturated carboxylic acid and an aliphatic polyhydric amine compound will be used. Moreover, preferred reactions are an addition reaction between an unsaturated carboxylic acid or amide having a nucleophilic substituent such as a hydroxyl group, an amino group, mercapto group, and the like and a monofunctional or polyfunctional isocyanate or epoxy; a dehydration condensation reaction between the same and a monofunctional or polyfunctional carboxylic acid; and the like. Furthermore, products resulting from the addition reaction of an unsaturated carboxylic acid ester or amide having an electrophilic substituent such as an isocyanate group, epoxy group, and the like with a monfunctional or polyfunctional alcohol, amine or thiol; and products resulting from a substitution reaction of an unsaturated carboxylic ester or amide having a leaving group such as a halogen group, tosyloxy group and the like with a monofunctional or polyfunctional alcohol, amine, or thiol, are preferred. As a different example, groups of compounds substituted with an unsaturated phosphonic acid, styrene, vinyl ether and the like instead of the aforementioned unsaturated carboxylic acid may also be used.

Specific examples of an ester monomer formed by an unsaturated carboxylic acid and an aliphatic polyhydric alcohol compound include the following acrylic acid esters: ethylene glycol diacrylate; triethylene glycol diacrylate; 1,3-butanediol diacrylate; tetramethylene glycol diacrylate; propylene glycol diacrylate; neopentyl glycol diacrylate; trimethylolpropane triacrylate; trimethylolpropane tri(acryloyloxypropyl)ether; trimethylolethane triacrylate; hexanediol diacrylate; 1,4-cyclohexanediol diacrylate; tetraethylene glycol diacrylate; pentaerythritol diacrylate; pentaerythritol triacrylate; pentaerythritol tetracrylate; dipentaerythritol diacrylate; dipentaerythritol hexaacrylate; sorbitol triacrylate; sorbitol tetraacrylate; sorbitol pentaacrylate; sorbitol hexaacrylate; tri(acryloyloxyethyl)isocyanurate; polyester acrylate oligomer; isocyanuric acid EO-modified triacrylate, and the like.

Specific examples of methacrylic acid esters to be used therefor include: tetramethylene glycol dimethacrylate; triethylene glycol dimethacrylate; neopentyl glycol dimethacrylate; trimethylolpropane trimethacrylate; trimethylolethane trimethacrylate; ethylene glycol dimethacrylate; 1,3-butanediol dimethacrylate; hexanediol dimethacrylate; pentaerythritol diamethacrylate; pentaerythritol trimethacrylate; pentaerythritol tetramethacrylate; dipentaerythritol dimethacrylate; dipentaerythritol hexamethacrylate; sorbitol trimethacrylate; sorbitol tetramethacrylate; bis[p-3(methacryloxy-2-hydroxypropoxy)phenyl] dimethyl methane; bis-[p-(methacryloxyethoxy)phenyl] dimethyl methane; and the like.

Specific examples of itaconic acid esters to be used therefor include: ethylene glycol diitaconate; propylene glycol diitaconate; 1,3-butanediol diitaconate; 1,4-butanediol diitaconate; tetramethylene glycol diitaconate; pentaerythritol diitaconate; sorbitol tetraitaconate, and the like.

Specific examples of crotonic acid esters to be used therefor include: ethylene glycol dicrotonate; tetramethylene glycol dicrotonate; pentaerythritol dicrotonate; sorbitol tetracronate, and the like.

Specific examples of isocrotonic acid esters to be used therefor include: ethylene glycol diisocrotonate; pentaerythritol diisocrotonate; sorbitol tetraisocrotonate; and the like.

Specific examples of the maleic acid ester to be used therefor include: ethylene glycol dimaleate; triethylene glycol dimaleate; pentaerythritol dimaleate; sorbitol tetramaleate; and the like.

Other preferred examples of the ester include aliphatic alcoholic esters described in Japanese Patent Publication No. S51-47334, and Japanese Patent Application Laid-open No. S57-196231; esters having an aromatic skeleton described in Japanese Patent Application Laid-open Nos. S59-5240, S59-5241 and H2-226149; and esters having an amino group described in Japanese Patent Application Laid-open No. H1-165613. In addition, the aforementioned ester monomers may also be used as a mixture thereof.

Specific examples of a monomer of amides formed by an unsaturated carboxylic acid and an aliphatic polyvalent amine compound include methylene bis-acrylamide; methylene bis-methacrylamide; 1,6-hexamethylene bis-acrylamide; 1,6-hexamethylene bis-methacrylamide; diethylene triamine tris-acrylamide; xylylene bis-acrylamide; xylylene bis-methacrylamide, and the like. Other preferred examples of the amide monomer include those having a cyclohexylene structure as described in Japanese Patent Publication No. S54-21726.

Moreover, a urethane addition-polymerizable compound prepared using an addition reaction involving an isocyanate and a hydroxyl group is also preferred. Specific examples thereof include a vinyl urethane compound having therein two or more polymerizable vinyl groups that are obtained by performing the addition reaction of a vinyl monomer having a hydroxyl group represented by Formula (V) below with a polyisocyanate compound having therein two or more isocyanate groups as described in Japanese Patent Publication No. S48-41708:

CH$_2$=C(R$^4$)COOCH$_2$CH(R$^5$)OH  Formula (V)

wherein R$^4$ and R$^5$ each independently represent H or a methyl group.

Furthermore, preferable urethane addition-polymerizable compounds include urethane acrylates as described in Japanese Patent Application Laid-open No. S51-37193, and Japanese Patent Publication Nos. H2-32293 and H2-16765; and urethane compounds having an ethylene oxide skeleton as described in Japanese Patent Publication Nos. S58-49860, S56-17654, S62-39417 and S62-39418. Addition-polymerizable compounds having therein an amino structure or a sulfide structure as described in Japanese Patent Application Laid-open Nos. S63-277653, S63-260909 and H1-105238 may also be used.

Other examples thereof include polyfunctional acrylates and methacrylates such as polyester acrylates and epoxy acrylates resulting from the reaction of an epoxy resin with (meth)acrylic acid as described in Japanese Patent Application Laid-open No. S48-64183, and Japanese Patent Publication Nos. S49-43191 and S52-30490. Additional examples include the specific unsaturated compounds described in Japanese Patent Publication Nos. S46-43946, H1-40337 and H1-40336; and the vinyl phosphonate compounds described in Japanese Patent Application Laid-open No. H2-25493. In some case, it is preferable to use a structure containing the perfluoroalkyl group described in Japanese Patent Application Laid-open No. S61-22048. The compounds referred to as photocurable monomers and oligomers described in the Journal of the Adhesion Society of Japan, Vol. 20, No. 7, pp. 300 to 308 (1984) may also be used.

The specifics of how to use the polymerizable compound having an ethylenically unsaturated double bond, e.g., the structure thereof, single use or combined use of two or more thereof, various amounts to be added and the like, may be established arbitrarily in accordance with the performance design of the composition that is ultimately to be prepared. For example, the "compound having an ethylenically unsaturated double bond" will be selected based on the following viewpoints.

From the viewpoint of sensitivity, a compound with a structure having a large number of unsaturated groups per molecule is preferred, and in most cases, a bifunctional compound or more is preferred. A trifunctional compound or more is even more preferred to increase the strength of the film after curing, i.e., the image parts. The combined use of compounds having different numbers of functional groups, different polymerizable groups (e.g., an acrylic ester type compound, a methacrylic ester type compound, a styrene type compound and a vinyl ether type compound), is also effective, enabling the adjustment of both sensitivity and strength. From the viewpoint of curing sensitivity, the use of compounds having two or more (meth)acrylate ester structures is preferred, the use of compounds having 3 or more thereof is even more preferred, and the use of compounds having 4 or more thereof is most preferred. In addition, from the viewpoint of curing sensitivity and the development properties of unexposed portions, compounds having an EO-modified structure are preferred.

The selection and usage of the "compound having an ethylenically unsaturated double bond" are important factors with respect to compatibility and dispersibility of other components of the curable layer, e.g., binder polymer, photopolymerization initiator, and colorant (pigment, dye, etc.). For example, using a low-purity compound or using two or more compounds in combination may increase compatibility. In addition, a specific structure may be selected to improve adhesion to the inorganic substrate.

From the above viewpoints, preferred compounds include: bisphenol A diacrylate; bisphenol A diacrylate EO-modified structure; trimethylolpropane triacrylate; trimethylolpropane tri(acryloyloxypropyl)ether; trimethylolethane triacrylate; tetraethylene glycol diacrylate; pentaerythritol diacrylate; pentaerythritol triacrylate; pentaerythritol tetraacrylate; dipentaerythritol tetraacrylate; dipentaerythritol pentaacrylate; dipentaerythritol hexaacrylate; sorbitol triacrylate; sorbitol tetracrylate; sorbitol pentaacrylate; sorbitol hexaacrylate; tri(acryloyloxyethyl)isocyanulate; pentaerythritol tetraacrylate EO-modified structure; dipentaerythritol hexaacrylate EO-modified structure, and the like. As commercial products, the following are also preferred: urethane oligomers UAS-10 and UAB-140 (manufactured by Sanyo-Kokusaku Pulp Co., Ltd.); DPHA-4OH (manufactured by Nippon Kayaku Co., Ltd.); and UA-306H, UA-306T, UA-306I, AH-600, T-600, and AI-600 (manufactured by Kyoeisha Chemical Co., Ltd.)

Among these alternatives, the following are more preferred: bisphenol A diacrylate EO-modified structure; pentaerythritol triacrylate; pentaerythritol tetraacrylate; dipentaerythritol pentaacrylate; dipentaerythritol hexaacrylate; tri(acryloyloxyethyl)isocyanulate; pentaerythritol tetraacrylate EO-modified structure; dipentaerythritol hexaacrylate EO-modified structure, and the like. As commercial products, the following are more preferred: DPHA-4OH (manufactured by Nippon Kayaku Co., Ltd.); and UA-306H, UA-306T, UA-306I, AH-600, T-600, and AI-600 (manufactured by Kyoeisha Chemical Co., Ltd.)

The content of the "compound having an ethylenically unsaturated double bond" in the curable pigment composition is preferably from about 5 to about 50% by mass, more preferably from about 7 to about 40% by mass, and even more preferably from about 10 to about 35% by mass with respect to the total solids in the curable pigment composition. When the content of the "compound having an ethylenically unsaturated double bond" lies within the above range, it is effective in securing the hardness and adhesion to the inorganic substrate when forming the color pattern.

(D) Pigment

The curable pigment composition of the present invention contains at least one type of pigment as a colorant. The present invention places no particular restrictions on the pigment, and one type or a mixture of two or more types of various pigments that are already publicly known may be used.

Various inorganic and organic pigments that are already publicly known may be used as the pigment. In consideration of the fact that it is preferable for both inorganic and organic pigments to have a high transmittance, the use of as fine a pigment as possible is preferred, and in consideration of handling properties, the average particle size of the pigment is preferably from about 0.01 to about 0.1 µm, and more preferably from about 0.01 to about 0.05 µm.

Metal compounds such as metal oxides, metal complex salts and the like can be listed as examples of the aforementioned inorganic pigment. Specific examples include metal oxides of iron, cobalt, aluminum, cadmium, lead, copper, titanium, magnesium, chromium, zinc, antimony and the like, or complex oxides of thereof.

Examples of the aforementioned organic pigments include:
C.I. Pigment yellow 11, 24, 31, 53, 83, 93, 99, 108, 109, 110, 138, 139, 147, 150, 151, 154, 155, 167, 180, 185, and 199;
C.I. Pigment orange 36, 38, 43, and 71;
C.I. Pigment red 81, 105, 122, 149, 150, 155, 166, 171, 175, 176, 177, 209, 220, 224, 242, 254, 255, 264, and 270;
C.I. Pigment violet 19, 23, 32, and 39;
C.I. Pigment blue 1, 2, 15, 15:1, 15:3, 15:6, 16, 22, 60, and 66;
C.I. Pigment green 7, 36, and 37;
C.I. Pigment brown 25 and 28;
C.I. Pigment black 1 and 7;

In the present invention use of a pigment having a basic nitrogen atom in the structure thereof is preferred. A pigment with a basic nitrogen atom exhibits excellent dispersion in the composition. Although the cause therefor is not completely understood, it is believed that such a structure affects the quality of the affinity between the photosensitivity polymerization component and the pigment.

Preferred pigments are listed below, but the present invention is by no means limited thereto:

C.I. Pigment yellow 11, 24, 108, 109, 110, 138, 139, 150, 151, 154, 167, 180, and 185;
C.I. Pigment orange 36 and 71;
C.I. Pigment red 122, 150, 166, 171, 175, 177, 209, 224, 242, 254, 255, and 264;
C.I. Pigment violet 19, 23, and 32;
C.I. Pigment blue 15:1, 15:3, 15:6, 16, 22, 60, and 66.

These organic pigments may be used alone, or may be used in various combinations thereof to improve the color purity. Specific examples of such combinations are shown below.

For example, as the red pigment, either an anthraquinone pigment, or perylene pigment, diketo pyrrolo pyrrole pigment may be used alone or at least one type thereof may be used in a mixture with a disazo yellow pigment, isoindoline yellow pigment, quinophthalone yellow pigment or perylene red pigment, and the like. C.I. pigment red 177 can be listed as an anthraquinone pigment; C.I. pigment red 155 and C.I. pigment red 224 can be listed as a perylene pigment; C.I. pigment red 254 can be listed as a diketo pyrrolo pyrrole pigment; and from the point of color reproduction, a mixture thereof with C.I. pigment yellow 139 is preferred. In addition, the mass ratio of red pigment to yellow pigment is preferably 100:5 to 100:50. When the mass ratio lies within the aforementioned range, the color purity is effectively increased, and the light transmittance between 400 nm and 500 nm can be suppressed so that color reproduction is easily assured by preventing dominant wavelength from shifting toward shorter wavelength. A mass ratio of 100:30 to 100:50 is optimal. Red pigments may be combined to intended chromaticity.

As the green pigment a halogenated phthalocyanine pigment may be used alone, or in a mixture with a disazo yellow pigment, quinophthalone yellow pigment, azomethine yellow pigment, or isoindoline yellow pigment. Preferred examples include a mixture of C.I. pigment green 7, 36, or 37 with C.I. pigment yellow 83, C.I. pigment yellow 138, C.I. pigment yellow 139, C.I. pigment yellow 150, C.I. pigment yellow 180, or with C.I. pigment yellow 185. The mass ratio of green pigment and yellow pigment is preferably 100:5 to 100:150, and a range of 100:30 to 100:120 is especially preferred.

As the pigment for blue, either a phthalocyanine pigment may be used alone or in a mixture with a dioxazine violet pigment. For example, a mixture of C.I. pigment blue 15:6 and C.I. pigment violet 23 is preferred. The mass ratio of blue pigment and violet pigment is preferably from about 100:0 to about 100:30, and more preferably from about 100:10 to about 100:30.

From the viewpoint of contrast and avoiding color unevenness when manufacturing the color filter, a pigment primary particle size of from about 10 to about 100 nm is preferred, from about 10 to about 70 nm is more preferred, from about 10 to about 50 nm is even more preferred, and from about 10 to about 40 nm is most preferred.

A pigment content of about 20% by mass or more with respect to the total solids in the curable pigment composition is preferred, about 30% by mass or more is more preferred, and from about 30 to about 70% by mass is especially preferred. When the pigment content lies within the aforementioned range, a color pattern with an excellent hue at high concentration is obtained, which is preferred for obtaining a high-contrast, bright color filter.

In addition to components (A), (B), (C), and (D) described above, the curable pigment composition of the present invention may also contain the following optional components as necessary. Optional components (E) through (J) that may be included in the curable pigment composition of the present invention are described below.

(E) Dispersant

When the curable pigment composition of the present invention contains component (D) pigment, at least one type of dispersant will preferably be added from the viewpoint of increasing dispersibility of the pigment.

Dispersants (pigment dispersants) that may be used in the present invention include polymer dispersants (e.g., polyamide amines and salts thereof, polycarboxylic acids and salts thereof, high molecular weight unsaturated esters, modified polyurethanes, modified polyesters, modified poly (meth) acrylates, (meth)acrylate copolymers, and naphthalenesulfonic acid-formaldehyde condensates); and polyoxyethylene alkyl phosphoric acid esters; polyoxyethylene alkyl amines; alkanol amines; pigment derivatives; and the like.

Polymer dispersants may be further classified into straight chain polymers, terminal modified polymers, graft polymers, and block polymers based on the structures thereof.

The polymer dispersant adsorbs onto the surface of the pigment and acts to prevent reaggregation. Therefore, preferred structures include a terminal-modified polymer, graft polymer, or block polymer having a moiety that anchors it to the surface of the pigment. On the other hand, pigment derivatives are effective in promoting adsorption of the polymer dispersant by reforming the pigment surface.

Concrete examples of pigment dispersant include the following: "DISPERBYK-101 (polyamide amine phosphoric acid salt), -107 (carboxylic acid ester), -110 (copolymer containing an acidic group), -130 (polyamide), -161, -162, -163, -164, -165, -166, and -170 (high molecular weight copolymers)" and "BYK-P104 and -P105 (high molecular weight unsaturated polycarboxylic acids)" manufactured by BYK-Chemie GmbH; "EFKA4047, -4050, -4010, and -4165 (polyurethanes), EFKA4330 and -4340 (block copolymers), -4400, -4402 (modified polyacrylates), -5010 (polyester amide), -5765 (high molecular weight polycarboxylate), -6220 (fatty acid polyester), -6745 (phthalocyanine derivative), and -6750 (azo pigment derivative)" manufactured by Efka Additives Inc.; "AJISUPER PB821 and PB822" manufactured by Ajinomoto Fine Techno Co., Inc.; "FLOWLEN TG-710 (urethane oligomer)," and "POLYFLOW No. 50E, and No. 300 (acrylic copolymer)," manufactured by Kyoei Kagaku Co.; "DISPARLON KS-860, -873SN, -874, and #2150 (aliphatic multivalent carboxylic acid), #7004 (polyether ester type) and DA-703-50, DA-705, and DA-725" manufactured by Kusumoto Kasei Co.; "DEMOL RN and N (naphthelenesulfonic acid-formaldehyde condensates), MS, C, and SN-B (aromatic sulfonic acid-formaldehyde condensates)," "HOMOGENOL L-18 (high molecular weight polycarboxylic acid)," "EMULGEN920, -930, -935, and -985 (polyoxyethylene nonyl phenyl ethers)," and "ACETAMIN86 (stearyl amine acetate)," manufactured by Kao Corp.; "SOLSPERSE5000 (phthalocyanine derivative), -22000 (azo pigment derivative), -13240 (polyester amine), -3000, -17000, and -27000 (polymers with terminal functional moiety), and -24000, -28000, -32000, and -38500 (graft polymers)," manufactured by Lubrizol Japan, Ltd.; "NIKKOL T106 (polyoxyethylene sorbitan monooleate) and MYS-IEX (polyoxyethylene monostearate), manufactured by Nikko Chemical Co., Ltd.; and the like.

These dispersants may be used alone or as a combination of two or more types thereof. In the present invention the use of a combination of pigment derivative and polymer dispersant is especially preferred.

The content of dispersant in the curable pigment composition is preferably from about 1 to about 100% by mass, more preferably from about 3 to about 100% by mass, and even more preferably from about 5 to about 80% by mass with respect to the amount of pigment.

More specifically, when a polymer dispersant is used, a range of from about 5 to about 100% by mass with respect to the amount of pigment is preferred as the amount thereof, and a range of from about 10 to about 80% by mass is more preferred. Moreover, when a pigment derivative is used, a range of from about 1 to about 30% by mass with respect to the amount of pigment is preferred as the amount thereof, a range of from about 3 to about 20% by mass is more preferred, and a range of from about 5 to about 15% by mass is even more preferred.

From the viewpoint of curing sensitivity and color concentration, in the case of a pigment and a dispersant are used the total content of pigment and dispersant is preferably from about 30 to 90% by mass with respect to the total solids comprising the curable pigment composition, more preferably from about 40 to about 85% by mass, and even more preferably from about 50 to about 80% by mass.

(F) Sensitizer

The curable pigment composition of the present invention may contain at least one type of sensitizer to enhance the radical generating efficiency of the radical initiator, and to extend the photosensitive wavelength to longer wavelengths. The sensitizer that may be used in the present invention is preferably one that sensitizes the aforementioned photopolymerization initiator through an electron transfer mechanism or energy transfer mechanism.

Sensitizers that may be used in the present invention include those belonging to the types of compounds listed below and having an absorption wavelength in the range of from about 300 to about 450 nm (preferably from about 330 to about 450 nm).

Examples include the following: polynuclear aromatic compounds (e.g., phenanthrene, anthracene, pyrene, perylene, triphenylene, and 9,10-dialkoxyanthracene); xanthenes (e.g., fluorescein, eosin, erythrosine, rhodamine B, and rose bengal); thioxanthones (isopropylthioxanthone, diethyl thioxanthone, and chlorothioxanthone); cyanines (e.g., thiacarbocyanine and oxacarbocyanine); merocyanines (e.g., merocyanine and carbomerocyanine); phthalocyanines and thiazines (e.g., thionin, methylene blue, and toluidine blue); acridines (e.g., acridine orange, chloroflavin, and acriflavin); anthraquinones (e.g., anthraquinone); squaliums (e.g., squalium); acridine orange and coumarin (e.g., 7-diethylamino-4-methylcoumarin); ketocoumarin; phenothiazines; phenazines; styryl benzenes; azo compounds; diphenylmethane, triphenylmethane, distyryl benzenes, carbazoles, porphyrin, and spiro compounds; quinacridone, indigo, styryl, and pyrylium compounds; pyrromethene compounds; pyrazolo triazole compounds; benzothiazole compounds; balbituric acid derivatives; thiobarbituric acid derivatives; aromatic ketone compounds such as acetophenone, benzophenone, thioxanthone, Micheler's ketone, and the like; and heterocyclic compounds such as N-aryl-oxazolidinone and the like.

Additionally, examples include the compounds disclosed in European Patent No. 568,993, U.S. Pat. Nos. 4,508,811 and 5,227,227, and Japanese Patent Application Laid-open Nos. 2001-125255 and H11-271969.

Among these alternatives, more preferred examples include benzophenone, Michler's ketone, coumarin (e.g., 7-diethylamino-4-methylcoumarin), and ketocoumarin, etc.

One type of sensitizer may be used alone, or two or more types thereof may be used in combination.

From the viewpoint of light absorption efficiency into the depths and photopolymerization initiator the degradation efficiency of initiation, the content of sensitizer in the curable pigment composition is preferably from about 0.1 to about 20% by mass with respect to the total solids in the curable pigment composition, and more preferably from about 0.5 to about 15% by mass.

(G) Binder Polymer

At least one type of binder polymer may also be used according to need in the curable pigment composition of the present invention for the purpose of improving film properties and the like.

The use of a linear organic polymer as the binder polymer is preferred. A publicly known linear organic polymer may be arbitrarily used therefor. Preferably a linear organic polymer that is soluble or swellable in water or weakly alkaline water is selected to enable a layer to be developed in water or weakly alkaline water. The linear organic polymer is to be selected and used not only as a film forming agent, but also in accordance with the use of a water, weakly alkaline water, or organic solvent-based developing agent. For example, if a water-soluble organic polymer is used, development in water becomes possible.

Examples of such a linear organic polymer include radical-polymerized polymers having a carboxylic acid group on the side chain thereof as disclosed in Japanese Patent Application Laid-open No. S59-44615, Japanese Patent Publication Nos. S54-34327, S58-12577, and S54-25957, and Japanese Patent Application Laid-open Nos. S54-92723, S59-53836 and S59-71048; i.e., a resin wherein a monomer having a carboxylic acid group is polymerized alone or as a copolymer; a resin wherein a monomer having an acid anhydride is polymerized or alone as a copolymer, and the acid anhydride unit is hydrolyzed, half-esterified, or half-amidized; an epoxy acrylate wherein an epoxy resin is modified by an unsaturated monocarboxylic acid or acid anhydride; and the like. Examples of the monomer having a carboxylic acid group include acrylic acid, methacrylic acid, itaconic acid, crotonic acid, maleic acid, fumaric acid, 4-carboxyl styrene and the like, and examples of a monomer having an acid anhydride include maleic anhydride and the like.

Similarly, an acidic cellulose derivative having a carboxylic acid side chain is included therein. Additionally, a substance wherein a cyclic acid anhydride has been added to a polymer having a hydroxyl group and the like is useful therefor.

An alkaline-soluble resin is developed in alkaline-water, and when a copolymer is used as the alkaline-soluble resin, other monomers than the ones noted above may be used as compounds to be copolymerized. Examples of other monomers are shown as compounds (1) through (12) below.

(1) An acrylic acid ester and methacrylic acid ester having an aliphatic hydroxyl group such as 2-hydroxyethyl acrylate; 2-hydroxypropyl acrylate; 3-hydroxypropyl acrylate; 4-hydroxybutyl acrylate; 2-hydroxyethyl methacrylate; 2-hydroxypropyl methacrylate; 3-hydroxypropyl methacrylate; 4-hydroxybutyl methacrylate, and the like.

(2) An alkyl acrylate such as methyl acrylate; ethyl acrylate; propyl acrylate; butyl acrylate; isobutyl acrylate; amyl acrylate; hexyl acrylate; 2-ethylhexyl acrylate; octyl acrylate; benzyl acrylate; 2-chloroethyl acrylate; glycidyl acrylate; 3,4-epoxycyclohexyl methacrylate; vinyl acrylate; 2-phenylvinyl acrylate; 1-propenyl acrylate; allyl acrylate; 2-allyloxy ethyl acylate; propargyl acrylate, and the like.

(3) An alkyl methacrylate such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxy cyclohexyl methyl methacrylate, vinyl methacrylate, 2-phenylvinyl methacrylate, 1-propenyl methacrylate, allyl methacrylate, 2-allyloxy ethyl methacrylate, propargyl methacrylate, and the like.

(4) An acrylamide or methacrylamide such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, N-ethyl-N-phenyl acrylamide, vinyl acrylamide, vinyl methacrylamide, N,N-diallyl acrylamide, N,N-diallyl methacrylamide, allyl acrylamide, allyl methacrylamide, and the like.

(5) Vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether, and the like.

(6) Vinyl esters such as vinyl acetate, vinyl chloroacetate, vinyl butylate, vinyl benzoate, and the like.

(7) Styrenes such as styrene, α-methyl styrene, methyl styrene, chloromethyl styrene, p-acetoxystyrene, and the like.

(8) Vinyl ketones such as methyl vinyl ketone, ethyl vinyl ketone, propyl vinyl ketone, phenyl vinyl ketone and the like.

(9) Olefins such as ethylene, propylene, isopropylene, butadiene, isoprene, and the like.

(10) N-vinyl pyrrolidone, acrylonitrile, methacrylonitrile, and the like

(11) Unsaturated imides such as maleimide, N-acryloyl acrylamide, N-acetyl methacrylamide, N-propionyl methacrylamide, N-(p-chlrobenzoyl)methacrylamide, and the like.

(12) Methacrylic acid monomers having a heteroatom bonded in the α position. For example, the compounds disclosed in Japanese Patent Application Laid Open Nos. 2002-309057 (Application No. 2001-115595) and 2002-311569 (Application No. 2001-115598).

Among these alternatives, a (meth)acrylate resin having an allyl group and having both a vinyl ester group and carboxylic group on the side chains thereof; as well as the alkaline soluble resins disclosed in Japanese Patent Application Laid-open Nos. 2000-187322 and 2002-62698; and the alkaline soluble resin having an amide group on the side chain thereof disclosed in Japanese Patent Application Laid-open No. 2001-242612 all have an excellent balance of film strength, sensitivity, and developing properties, and are preferred.

In addition, the urethane binder polymers containing an acidic group disclosed in Japanese Patent Publication (JB-B) Nos. H7-120040, H7-120041, H7-120042, and H8-12424; Japanese Patent Application Laid-Open (JP-A) Nos. S63-287944, S63-287947, and H1-271741, and Japanese Patent Application No. H10-116232; and the urethane binder polymer having an acidic group and a double bond on the side chain thereof disclosed in Japanese Patent Application Laid-Open (JP-A) No. 2002-107918 are advantageous from the viewpoint of printing durability and suitability under low-exposure amount conditions because they have an excellent strength.

Also the acetal-modified polyvinyl alcohol binder polymers disclosed in the Specifications of European Patent Nos. 993966 and 1204000, and in Japanese Patent Application Laid-open No. 2001-318463 have an excellent balance of film strength and development properties, and are preferred.

Furthermore, polyvinyl pyrrolidone, polyethylene oxide and the like are useful as other water soluble linear organic polymers. Moreover, alcohol soluble nylon, polyether of 2,2-bis-(4 hydroxy phenyl)-propane and epichlorohydrin, and the like are useful to increase the film strength after curing.

The weight-average molecular weight of the binder polymer is preferably 5000 or more, and more preferably lies within the range of from about 10,000 to about 300,000; the number-average molecular weight is preferably about 1,000 or more, and more preferably lies within the range of from about 2,000 to about 250,000. The polydispersity (weight average molecular weight/number average molecular weight) is preferable about 1 or more, and more preferably within the range of from about 1.1 to about 10.

The binder polymer may be either a random polymer, block polymer, or graft polymer, etc.

The binder polymer may be synthesized by conventional, publicly known methods. Examples of the solvent used in the synthesis process include: tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethyl formamide, N,N-dimethyl acetamide, toluene, ethyl acetate, methyl lactate, ethyl lactate, dimethyl sulfoxide, water, and the like. These solvents can either be used alone or as a combination of two or more types thereof.

Publicly known compounds such as azo-based initiators, peroxide initiators, and the like may be listed as examples of the radical polymerization initiator used in the process of synthesizing the binder polymer.

(H) Cosensitizer

The curable pigment composition of the present invention preferably contains at least one type of cosensitizer. The cosensitizer has the function of further improving the sensitivity of the sensitizer and photopolymerization initiator to actinic radiation or the function of suppressing inhibition of the polymerization of a polymerizable compound by oxygen, etc.

Examples of such a cosensitizer include amines such as the compounds described in M. R. Sander et al., "Journal of Polymer Society," Vol. 10, p. 3173 (1972), Japanese Patent Publication No. S44-20189, Japanese Patent Application Laid-open Nos. S51-82102, S52-134692, S59-138205, S60-84305, S62-18537, and S64-33104, and Research Disclosure No. 33825. Triethanolamine, p-dimethylamino benzoate ethylester, p-formyldimethyl aniline, and p-methylthiodimethyl aniline may be listed as specific examples thereof.

Other examples of the cosensitizer include thiols and sulfides such as the thiol compounds described in Japanese Patent Application Laid-open No. S53-702, Japanese Patent Publication No. S55-500806, and Japanese Patent Application Laid-open No. H5-142772; and disulfide compounds of Japanese Patent Application Laid-open No. S56-75643. Specific examples thereof include 2-mercaptobenzothiazole, 2-mercaptobenzoxazole, 2-mercaptobenzimidazole, 2-mercapto-4(3H)-quinazoline, and β-mercaptonaphthalene.

Further other examples of the cosensitizer include amino acid compounds (e.g. N-phenylglycine, etc.); the organometallic compounds described in Japanese Patent Publication No. S48-42965 (e.g. tributyl tin acetate, etc.); hydrogen donors described in Japanese Patent Publication No. S55-34414; and sulfur compounds (e.g. trithiane, etc.) described in Japanese Patent Application Laid-open No. H6-308727.

When a cosensitizer is used, for the content of the cosensitizer in the curable pigment composition a range of from about 0.1 to about 30% by mass with respect to the total solids (mass) in the curable pigment composition is preferred from the viewpoint of improving the curing rate by balancing the polymerization growth rate and chain transfer, a range of from about 1 to about 25% by mass is more preferred, and a range of from about 0.5 to about 20% by mass is even more preferred.

(I) Polymerization Inhibitor

It is desirable to add a small amount of thermal polymerization inhibitor in the present invention to inhibit unnecessary thermal polymerization of the "compound having an ethylenically unsaturated double bond" during preparation or storage of the curable pigment composition.

Examples of the thermal polymerization inhibitor that may be used in the present invention include hydroquinone, p-methoxyphenol, di-t-butyl-p-cresol, pyrogallol, t-butylcatechol, benzoquinone, 4,4'-thio bis(3-methyl-6-t-butylphenol), 2,2'-methylene-bis(4-methyl-6-t-butylphenol) and N-nitrosophenylhydroxylamine cerous salt.

The amount of thermal polymerization inhibitor added to the curable pigment composition is preferably from about 0.01 to about 5% by mass with respect to the total mass of the curable pigment composition.

As needed, a higher fatty acid such as behenic acid or a derivative thereof such as behenic acid amide may be added and unevenly distributed on the surface of the photosensitive layer during the drying process after coating to prevent the polymerization inhibition by oxygen. The content of the higher fatty acid derivative is preferably from about 0.5 to about 10% by mass with respect to the total mass of the curable pigment composition.

(J) Other Additives

In addition, publicly known additives such as inorganic fillers and plasticizers to improve the physical properties of the film after curing, and a sensitization agent to enhance the inking property on the surface of the curable layer may be added.

Examples of plasticizer include dioctyl phthalate, didodecyl phthalate, triethylene glycol dicaprylate, dimethyl glycol phthalate, tricresyl phosphate, dioctyl adipate, dibutyl sebacate or triacetyl glycerol.

When additives are used, the additives may be added at about 10% by mass or less with respect to the total mass of "(C) a compound having an ethylenically unsaturated double bond" and the additives.

As noted above, the curable pigment composition of the present invention exhibits a high level of adhesion when formed on an inorganic material by providing a constitution in combination with the adhesion auxiliary agent of an inorganic material. Therefore, the color filter and method for producing the same of the present invention is suitable for the optical three-dimensional machining, holography, and image display uses such as color filters and the like.

The color filter of the present invention is one providing a color pattern on the adhesion auxiliary agent-applied surface of an inorganic material whereto an adhesion auxiliary agent has been applied, and preferably it is fabricated using the process for producing the color filter of the present invention previously described.

Since the color filter of the present invention is constituted using an inorganic material treated with an adhesion auxiliary agent and the previously described curable pigment composition, the color pattern formed thereon exhibits a high level of adhesion with the inorganic substrate. In addition, the cured composition (i.e., the color pattern) has excellent development resistance properties, and has excellent adhesion with the inorganic substrate in the exposed regions, thereby a high resolution pattern is obtained. Therefore, the color filter and method for producing the same of the present invention may be suitably used for the fabrication of solid-state image sensing devices such as a CCD and the like, and in particular it is most suitable for high resolution CCD devices, CMOS, and the like exceeding 1 million pixels.

The color filter of the present invention may be used, for example, as a color filter placed between the light receiver and the microlens for condensing light in each pixel constituting a CCD.

The present invention is based on the discovery that a constitution wherein (1) an inorganic substance treated with a specific adhesion auxiliary agent is used, and (2) a specific organosilane compound is also used as a silane compound added to the pigment composition used for forming a layer on the surface of the inorganic material, is effective in improving adhesion between the inorganic material and the color pattern formed thereon.

Exemplary aspects of the invention are listed below.

<1> A method for producing a color filter comprising:

applying an adhesion auxiliary agent onto an inorganic material;

forming a curable layer on the inorganic material to which the adhesion auxiliary agent has been applied by applying a curable pigment composition containing an organosilane compound (A) represented by Formula (I) below, a photopolymerization initiator (B), a compound having an ethylenically unsaturated double bond (C), and a pigment (D);

exposing the curable layer to light patternwise using a mask; and developing the curable layer after exposure to form a color pattern:

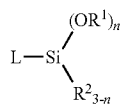

Formula (I)

wherein, in Formula (I), L represents a monovalent organic group; $R^1$ and $R^2$ each independently represent hydrocarbon groups; and n represents an integer of 1 to 3.

<2> The method for producing a color filter of <1> above, wherein the aforementioned organosilane compound is a compound represented by Formula (II) below:

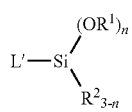

Formula (II)

wherein, in Formula (II), L' represents a monovalent organic group containing a hydrophilic moiety; $R^1$ and $R^2$ each independently represent a hydrocarbon group; and n represents an integer of 1 to 3.

<3> The method for producing a color filter of <1> above, wherein the aforementioned organosilane compound is a compound represented by Formula (III) or Formula (IV) below:

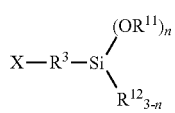

Formula (III)

wherein, in Formula (III), $R^{11}$ and $R^{12}$ each independently represent a hydrocarbon group having 1 to 6 carbon atoms; $R^3$ represents a divalent hydrocarbon group having 1 to 12 carbon atoms, the hydrocarbon structure thereof optionally having a cyclic structure and/or unsaturated bond(s); X represents a monovalent hydrophilic moiety; and n represents an integer of 1 to 3,

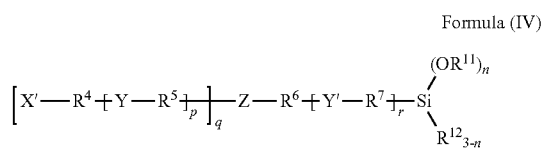

Formula (IV)

wherein, in Formula (IV), $R^{11}$ and $R^{12}$ each independently represent a hydrocarbon group having 1 to 6 carbon atoms; $R^4$, $R^5$, $R^6$, and $R^7$ each independently represent a single bond or a hydrocarbon chain having 1 to 12 carbon atoms, and when $R^4$, $R^5$, $R^6$, and $R^7$ represent a hydrocarbon chain, the structure thereof may have a cyclic structure and/or unsaturated bond(s); X' represents a hydrogen atom or a monovalent substituent group optionally containing a hydrophilic moiety; Y and Y' each independently represent a divalent hydrophilic moiety; Z represents a divalent or trivalent hydrophilic moiety depending on the value of q; p represents an integer of 0 to 20, q represents 1 or 2, r represents an integer of 0 to 3, and n represents an integer of 1 to 3.

<4> The method for producing a color filter of <3> above, wherein the aforementioned organosilane compound is the organosilane compound represented by Formula (IV) above, and at least one have amino group.

<5> The method for producing a color filter according to <1>, wherein the content of the aforementioned organosilane compound in the curable pigment composition is from about 0.1 to about 1.0% by mass with respect to the total solid content of the curable pigment composition.

<6> The method for producing a color filter of <1> above, wherein the aforementioned adhesion auxiliary agent is a compound represented by Formula (A) below:

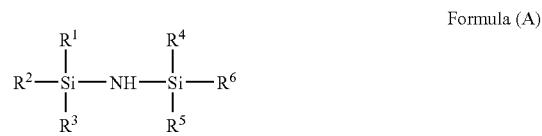

Formula (A)

wherein, in Formula (A), $R^1$ to $R^6$ each independently represents a hydrocarbon group having 1 to 4 carbon atoms, the structures thereof optionally having a cyclic structure and/or unsaturated bond(s).

<7> The method for producing a color filter of <6>, wherein the hydrocarbon groups of 1 to 4 carbon atoms in Formula (A) above are selected from a group consisting of methyl groups, ethyl groups, propyl groups, and butyl groups.

<8> A color filter having a color pattern on a surface of an inorganic material to which an adhesion auxiliary agent has been applied.

<9> The method for producing a color filter of <1> above, wherein the adhesion auxiliary agent is applied by any of coating, inkjet application, printing, and vapor deposition.

<10> The method for producing a color filter of <1>, wherein the forming of the curable layer is performed by any of coating, inkjet application, printing, and vapor deposition.

<11> A color filter produced by the method for producing a color filter of <1>.

<12> The color filter of <11>, wherein the film thickness of the curable pigment composition applied in the forming of a curable layer is about from 0.1 to about 5 μm.

<13> The method for producing a color filter of <1>, wherein the exposing of the curable layer is performed by g-ray or i-ray irradiation at a dose of from about 5 to about 1500 mJ/cm$^2$.

<14> The method for producing a color filter of <1>, wherein the developing of the curable layer uses an organic alkaline developing solution as a developing solution.

<15> The method for producing a color filter of <1> further including curing the formed color pattern by heating and/or exposure to light subsequent to the applying an adhesion auxiliary agent, forming a curable layer, exposing the curable layer, and developing the curable layer.

EXAMPLES

The present invention is described more concretely below through examples, but the present invention is not limited to the following examples provided the spirit and scope of the present invention are retained. Unless otherwise stated, "%" and "parts" are based on mass.

Example 1

1. Preparation of Curable Pigment Composition
(1-1) Preparation of Liquid Pigment Dispersion A liquid pigment dispersion (P1) was prepared by mixing and dispersing with a bead mill for 15 hours a liquid mixture containing 15 parts of pigment wherein C. I. Pigment Green 36, C. I. Pigment Green 7, and C. I. Pigment Yellow 139 were mixed at a ratio of 80/20/35 (mass ratio); 10 parts of BYK2001 (DISPERBYK manufactured by BYK Chemie GmbH, solids concentration 45.0%) (approximately 4.5 parts converted to solids) as dispersant; 5.5 parts benzyl methacrylate/methacrylic acid copolymer (molar ratio: 70/30); and 69.5 parts cyclohexanone as the solvent.

When the average particle size of the pigment in the liquid pigment dispersion (P1) was measured by dynamic light scattering method using a MICROTRAC NANOTRAC UPA-EX150 manufactured by Nikkiso Co., Ltd., it was found to be 200 nm.

(1-2) Preparation of Curable Pigment Composition (Liquid Coating)

Using the above liquid pigment dispersion P1, components from the following list of ingredients were mixed and stirred to prepare a solution of the curable pigment composition P1.
(Composition)

| | |
|---|---|
| Above liquid pigment dispersion (P1): | 65 parts |
| Above exemplary compound (103) | 0.15 parts |
| ((A) specific organosilane compound): | |
| Octane dione-O-benzoyl oxime | 1.5 parts |
| ((B) photopolymerization initiator) | |
| Dipentaerythritol hexaacrylate: | 6 parts |
| ((C) compound containing ethylenically unsaturated bond) | |
| Alkaline-soluble resin (binder polymer): | 2 parts |
| (benzyl methacrylate/methacrylic acid copolymer | |
| (molar ratio: 70/30), Mw: 30,000) | |
| PGMEA (solvent): | 25.35 parts |

With respect to storage stability of the solution of the curable pigment composition P1, the viscosity before and after storage for one month at room temperature was measured using a type E viscosimeter (manufactured by Toki Sangyo Co., Ltd.) and evaluated based on the following criteria. Table 1 below shows the results of the evaluation.
(Evaluation Criteria)
A: No increase in viscosity was found.
B: An increase in viscosity of ≧5% but <10% was found.
C: An increase in viscosity of ≧10% was found.

2. Fabrication of Color Filter
(2-1) Formation of Curable Layer

A silicon substrate was prepared, and vapor deposition of HMDS (hexamethyl disilazane, manufactured by Fujifilm Electronics Materials) on the surface of the silicon substrate was performed under the conditions described below using an LPAH low pressure adhesion treatment apparatus (built-in an SK-60BW coating apparatus for spin coating) (manufactured by Dainippon Screen Mfg. Co., Ltd.). At that time the water contact angle on the silicon substrate was 62° measured by a DROPMASTER 500 (manufactured by Kyowa Interface Science Co., Ltd.).

Then, the solution of curable pigment composition P1 was spin-coated onto the HMDS-deposited side of the silicon substrate under the conditions described below using an SK-60BW coating apparatus for spin coating (manufactured by Dainippon Screen Mfg. Co., Ltd.), and a prebake was performed for 120 seconds at 100° C. to form the curable layer.
(Vapor Deposition Conditions)
Substrate temperature: 110° C.
Vapor deposition time: 45 seconds
(Spin Coating Conditions)
Droplet amount: 2 g
Coating speed: 1000 r.p.m.
Coating thickness (dried thickness): 1.0 μm
Coating temperature: 23° C.
(2-2) Exposure and Development The curable layer formed by the above method was exposed with an FPA-3000i5+(CANON, INC.) i-ray exposure device using a Bayer pattern test photo mask with line widths of 1.0 to 7.0 μm. After exposure the entire surface of the curable layer was covered with a 60% aqueous solution of an organic developer (CD2000, manufactured by Fujifilm Electronics Materials) and let stand for 60 seconds. In that manner, a color pattern was formed on the silicon substrate.
(2-3) Rinse Treatment After stationary step, the developer was rinsed away by injecting pure water in a straight form thereon, and then the curable layer (color pattern) that had been exposed and developed was heated for 5 minutes on a 220° C. hot plate (post bake). In that manner, a color filter was formed on the silicon substrate.

3. Performance Evaluation

The above curable layer and color filter were evaluated as described below for development residue and adhesion of the color pattern to the substrate. Table 1 below shows the results of the evaluation.

(1) Development Residue (Residue on Curable Layer)

Exposure was performed by changing to various doses in the range of 50 to 1250 mJ/cm$^2$, after the post bake following an exposure of 100 mJ through a 1.5 μm Bayer pattern the residue in the pattern was observed using a measurement SEM (S-9260A, manufactured by Hitachi High-Technologies Corporation), and an evaluation was performed based on the following criteria.
(Evaluation Criteria)
A: No residue at all was found in the unexposed parts.
B: A slight amount of residue was found in the unexposed parts, but not problematic from a practical viewpoint.

C: A conspicuous amount of residue was found in the unexposed parts.

(2) Adhesion to Substrate

Observations by optical microscope were performed to determine whether pattern defects had occurred in the color filter, and the adhesion to substrate after the post bake was evaluated based on the following criteria.

(Evaluation Criteria)

A: No pattern defects at all were observed.
B: Almost no pattern defects were observed.
C: A small number of partial pattern defects were observed.
D: A conspicuous number of pattern defects were observed.

Examples 2 to 12

A color pattern was formed and a color filter was prepared in the same manner as in Example 1, except that exemplary compound (103), which is the specific organosilane compound used in preparation of the curable pigment composition P1 in Example 1, was replaced by another exemplary compound (specific organosilane compound) as shown in Table 1 below. Evaluation was performed in the same manner as in Example 1. Table 1 below shows the results of the evaluation.

Comparative Example 1

A color pattern was formed and a color filter was prepared in the same manner as in Example 1, except that exemplary compound (103), which is the specific organosilane compound used in preparation of the curable pigment composition P1 in Example 1, was not added thereto. Evaluation was performed in the same manner as in Example 1. Table 1 below shows the results of the evaluation.

Comparative Example 2

A color pattern was formed and a color filter was prepared in the same manner as in Comparative Example 1, except that steam vapor deposition on the silicon substrate, which was performed in Comparative Example 1, was not performed, and the same evaluation as in Example 1 was performed. Table 1 shows the results of the evaluation.

Comparative Example 3

A color pattern was formed and a color filter was prepared in the same manner as in Example 1, except that steam vapor deposition on the silicon substrate, which was performed in Example 1, was not performed, and the same evaluation as in Example 1 was performed. Table 1 shows the results of the evaluation.

Comparative Example 4

A color pattern was formed and a color filter was prepared in the same manner as in Example 1, except that vinyl trichlorosilane (a silane compound) was used as the organosilane compound in Example 1, and the same evaluation as in Example 1 was performed. Table 1 shows the results of the evaluation.

TABLE 1

| | Organosilane compound | | Adhesion auxiliary agent | Storability | | Adhesion |
|---|---|---|---|---|---|---|
| | Type | Content [% of solids] | (Adhesion treatment) | of composition | Residue | to substrate |
| Example 1 | Exemplary compound (103) | 0.6 | Yes | A | A | A |
| Example 2 | Exemplary compound (102) | 0.6 | Yes | A | A | B |
| Example 3 | Exemplary compound (101) | 0.6 | Yes | A | A | B |
| Example 4 | Exemplary compound (36) | 0.6 | Yes | A | A | B |
| Example 5 | Exemplary compound (1) | 0.6 | Yes | A | A | B |
| Example 6 | Exemplary compound (4) | 0.6 | Yes | A | A | B |
| Example 7 | Exemplary compound (63) | 0.6 | Yes | A | A | B |
| Example 8 | Exemplary compound (64) | 0.6 | Yes | A | A | B |
| Example 9 | Exemplary compound (103) | 1.2 | Yes | B | A | A |
| Example 10 | Exemplary compound (103) | 1.0 | Yes | A | A | A |
| Example 11 | Exemplary compound (103) | 0.1 | Yes | A | A | A |
| Example 12 | Exemplary compound (103) | 0.05 | Yes | A | A | C |
| Comp. Ex. 1 | None | — | Yes | A | A | C |
| Comp. Ex. 2 | None | — | No | A | A | D |
| Comp. Ex. 3 | Exemplary compound (103) | 0.6 | No | A | A | D |
| Comp. Ex. 4 | Vinyl trichlorosilane | 0.6 | Yes | A | C | D |

As shown in Table 1 above, in the Examples the color pattern formed on an inorganic substrate treated with the adhesion auxiliary agent by using a pigment composition containing the specific organosilane compound increased adhesion thereof to the inorganic substrate while retaining the level of residue in the pattern in contrast to Comparative Example 1, wherein the specific organosilane compound was not used, and Comparative Example 2, wherein treatment with the adhesion auxiliary agent also was not performed. In the Examples, by strengthening the interaction between the inorganic substrate and the color pattern and increasing adhesion thereby, erosion by the developer of the image parts (cured parts), which are the exposed region, is inhibited, and developer penetration of the uncured parts, which are the unexposed parts, is promoted; as a result, the residue level was improved, and excellent pattern forming properties on an inorganic substrate were realized. Furthermore, selecting a constitution wherein application of an adhesion auxiliary agent to the inorganic substrate is combined with the use of a curable pigment composition containing the specific organosilane compound enabled control over the amount of specific organosilane compound to be added, and improved storage stability when the curable pigment composition is prepared as a solution.

Moreover, in Comparative Example 3 wherein a prior art, publicly known silane compound (vinyl trichlorosilane) was used, good results were not obtained for adhesion to the substrate and amount of residue.

However, by simply adding an arbitrary silane coupling agent sufficient adhesion cannot be obtained or conversely, by adding a silane coupling agent, adhesion of color layer in the regions to be developed and removed (in a negative type, the unexposed parts) to the inorganic substrate will be increased, and therefore development residue will easily remain in those regions.

There is a problem with the aforementioned primary and secondary amines because over time Michael addition to the ethylenically unsaturated bonds in the composition will occur, thereby causing the viscosity of the composition to increase and the composition will gelate.

In accordance with the present invention it is possible to provide a color filter and method for producing the same wherein a color pattern having excellent adhesion to the inorganic material that forms the substrate is provided while holding development residue in the unexposed, uncured parts to a low level and retaining good pattern forming properties. In addition, the method for producing the color filter of the present invention is effective for producing the aforementioned color filter at a high level of productivity.

All publications, and technical standards mentioned in this specification are herein incorporated by reference to the same extent as if each individual publication, patent application, or technical standard was specifically and individually indicated to be incorporated by reference.

What is claimed is:

1. A method for producing a color filter comprising:
applying an adhesion auxiliary agent onto an inorganic material;
forming a curable layer on the inorganic material to which the adhesion auxiliary agent has been applied by applying a curable pigment composition containing an organosilane compound (A) represented by Formula (II) below, a photopolymerization initiator (B), a compound (C) having an ethylenically unsaturated double bond, and a pigment (D);
exposing the curable layer to light patternwise through a mask; and
developing the curable layer after exposure to form a color pattern:

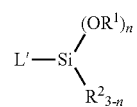

Formula (II)

wherein, in Formula (II), L' represents a monovalent organic group containing a hydrophilic moiety selected from: a hydroxyl group, an amino group, a carbonyl group, a thiocarbonyl group, a mercapto group, a carbamoyl group, a carbamoyloxy group, a carbamoyl amino group, a sulfonamide moiety, a urethane moiety, a thiourethane moiety, an amide moiety, a thioether moiety, a urea moiety, a thiourea moiety, an oxycarbonyloxy moiety, an ammonium group, a secondary amine moiety, a tertiary amine moiety, a polyethyleneoxy moiety represented by $-(C_2-CH_2O)_a-$ (in which a is an integer of 2 or more), or a partial structure represented by any of the following structural formulae (monovalent to trivalent hydrophilic moieties):

Monovalent hydrophilic moieties

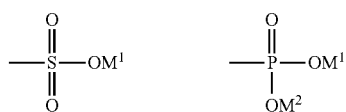

Divalent hydrophilic moieties

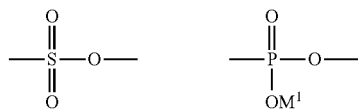

Trivalent hydrophilic moieties

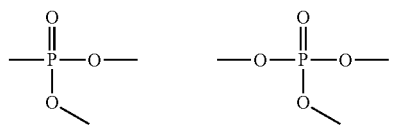

wherein $M^1$ and $M^2$ each independently represents a hydrogen atom or monovalent metal atom; $R^1$ and $R^2$ each independently represents a hydrocarbon group; and n represents an integer of 1 to 3; and the content of the organosilane compound in the curable pigment composition is from about 0.1 to about 1.0% by mass with respect to the total solid content of the curable pigment composition.

2. The method for producing a color filter according to claim 1, wherein the organosilane compound is a compound represented by Formula (III) or Formula (IV) below:

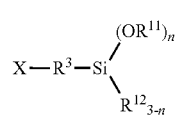

Formula (III)

wherein, in Formula (III), $R^{11}$ and $R^{12}$ each independently represents a hydrocarbon group having 1 to 6 carbon atoms; $R^3$ represents a divalent hydrocarbon group having 1 to 12 carbon atoms, the hydrocarbon structure thereof optionally having a cyclic structure and/or unsaturated bond(s); X represents a monovalent hydrophilic moiety selected from: a hydroxyl group, an amino group, a carbonyl group, a thiocarbonyl group, a mercapto group, a carbamoyl group, a carbamoyloxy group, a carbamoyl amino group, a sulfonamide moiety, a urethane moiety, a thiourethane moiety, an amide moiety, a thioether moiety, a urea moiety, a thiourea moiety, an oxycarbonyloxy moiety, an ammonium group, or a partial structure represented by either of the following structural formulae (monovalent hydrophilic moieties):

Monovalent hydrophilic moieties

where $M^1$ and $M^2$ each independently represents a hydrogen atom or monovalent metal atom; and n represents an integer of 1 to 3, Formula (IV)

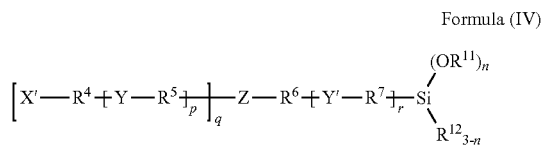

wherein, in Formula (IV), $R^{11}$ and $R^{12}$ each independently represents a hydrocarbon group having 1 to 6 carbon atoms; $R^4$, $R^5$, $R^6$, and $R^7$ each independently represent a single bond or a hydrocarbon chain having 1 to 12 carbon atoms, and when $R^4$, $R^5$, $R^6$, and $R^7$ represent a hydrocarbon chain, the structure thereof may have a cyclic structure and/or unsaturated bond(s); X' represents a monovalent substituent group containing a hydrophilic moiety selected from: a hydroxyl group, an amino group, a carbonyl group, a thiocarbonyl group, a mercapto group, a carbamoyl group, a carbamoyloxy group, a carbamoyl amino group, a sulfonamide moiety, a urethane moiety, a thiourethane moiety, an amide moiety, a thioether moiety, a urea moiety, a thiourea moiety, an oxycarbonyloxy moiety, an ammonium group, or a partial structure represented by either of the following structural formulae (monovalent hydrophilic moieties):

Monovalent hydrophilic moieties

where $M^1$ and $M^2$ each independently represents a hydrogen atom or monovalent metal atom; Y and Y' each independently represent a divalent hydrophilic moiety; Z represents a divalent or trivalent hydrophilic moiety depending on the value of q; p represents an integer of 0 to 20, q represents 1 or 2, r represents an integer of 0 to 3, and n represents an integer of 1 to 3.

3. The method for producing a color filter according to claim 2, wherein the organosilane compound is an organosilane compound represented by Formula (IV) above, and at least one of X', Y, Y' and Z contains an amino group.

4. The method for producing a color filter according to claim 1, wherein the adhesion auxiliary agent is a compound represented by Formula (A) below:

Formula (A)

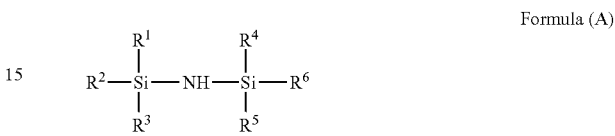

wherein, in Formula (A), $R^1$ to $R^6$ each independently represents a hydrocarbon group having 1 to 4 carbon atoms, the structures thereof optionally having a cyclic structure and/or unsaturated bond(s).

5. The method for producing a color filter according to claim 4, wherein the hydrocarbon groups of 1 to 4 carbon atoms in Formula (A) are selected from the group consisting of a methyl group, an ethyl group, a propyl group, and a butyl group.

6. The method for producing a color filter according to claim 1, wherein the adhesion auxiliary agent is applied by any of coating, inkjet application, printing, and vapor deposition.

7. The method for producing a color filter according to claim 1, wherein the forming of the curable layer is performed by any of coating, inkjet application, printing, and vapor deposition.

8. A color filter produced by the method for producing a color filter according to claim 1.

9. The color filter according to claim 8, wherein the film thickness of the curable pigment composition applied in the forming of the curable layer is from about 0.1 to about 5 pm.

10. The method for producing a color filter according to claim 1, wherein the exposing of the curable layer is performed by g-ray or i-ray irradiation at a dose of from about 5 to about 1500 mJ/cm2.

11. The method for producing a color filter according to claim 1, wherein the developing of the curable layer is performed by using an organic alkaline developing solution as a developing solution.

12. The method for producing a color filter according to claim 1, further comprising curing the formed color pattern by heating and/or exposure to light subsequent to applying the adhesion auxiliary agent, forming the curable layer, exposing the curable layer, and developing the curable layer.

13. The method for producing a color filter according to claim 1, wherein the hydrophilic moiety is an amino group.

14. The method for producing a color filter according to claim 1, wherein the photopolymerization initiator (B) is an oxime compound.

* * * * *